US012568746B2

(12) United States Patent
Wang et al.

(10) Patent No.: US 12,568,746 B2
(45) Date of Patent: Mar. 3, 2026

(54) DISPLAY SUBSTRATE, PREPARATION METHOD THEREOF, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Qinghe Wang, Beijing (CN); Bin Zhou, Beijing (CN); Tongshang Su, Beijing (CN); Dacheng Zhang, Beijing (CN); Jun Wang, Beijing (CN); Ning Liu, Beijing (CN); Yongchao Huang, Beijing (CN); Jun Cheng, Beijing (CN); Liangchen Yan, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 977 days.

(21) Appl. No.: 17/637,817

(22) PCT Filed: Apr. 21, 2021

(86) PCT No.: PCT/CN2021/088803
§ 371 (c)(1),
(2) Date: Feb. 24, 2022

(87) PCT Pub. No.: WO2022/222084
PCT Pub. Date: Oct. 27, 2022

(65) Prior Publication Data
US 2024/0122032 A1      Apr. 11, 2024

(51) Int. Cl.
*H10K 59/80* (2023.01)
*H10K 50/824* (2023.01)
(Continued)

(52) U.S. Cl.
CPC ..... *H10K 59/80517* (2023.02); *H10K 50/824* (2023.02); *H10K 59/1201* (2023.02);
(Continued)

(58) Field of Classification Search
CPC ........... H10K 59/80517; H10K 50/824; H10K 59/1201; H10K 59/1315; H10K 59/80522;
(Continued)

(56) References Cited

U.S. PATENT DOCUMENTS

| | | |
|---|---|---|
| 2017/0170431 A1 | 6/2017 | Im et al. |
| 2017/0186831 A1 | 6/2017 | Nam et al. |

(Continued)

FOREIGN PATENT DOCUMENTS

| | | |
|---|---|---|
| CN | 106887448 A | 6/2017 |
| CN | 107039491 A | 8/2017 |

(Continued)

OTHER PUBLICATIONS

Song; Yong-xi, CN-112103326-A, Machine Translation (Year: 2020).*
Office Action dated Dec. 29, 2025 for CN 202180000858.6 and English Translation.

*Primary Examiner* — Jacob Y Choi
*Assistant Examiner* — Grace Cha
(74) *Attorney, Agent, or Firm* — Ling Wu; Stephen Yang; Ling and Yang Intellectual Property

(57) ABSTRACT

A display substrate including a drive-circuit layer and a light-emitting structure layer, a preparation method thereof, and a display device, the light-emitting structure layer includes an anode, a pixel definition layer, an organic light-emitting layer and a cathode, and an auxiliary electrode and an organic light-emitting block, arranged sequentially, the pixel definition layer includes an anode opening exposing the anode and an electrode opening exposing the aux-
(Continued)

iliary electrode, the organic light-emitting block is separated from the organic light-emitting layer, the auxiliary electrode includes the first, second and third auxiliary electrodes arranged sequentially; the cathode includes a first horizontal lapping part lapping with the first auxiliary electrode and a second sidewall lapping part lapping with the second auxiliary electrode, the thickness of the second sidewall lapping part in the direction parallel to the substrate is greater than that of the first horizontal lapping part in the direction perpendicular to the substrate.

19 Claims, 13 Drawing Sheets

(51) Int. Cl.
    *H10K 59/12*       (2023.01)
    *H10K 59/131*     (2023.01)
(52) U.S. Cl.
    CPC ... *H10K 59/1315* (2023.02); *H10K 59/80522*
        (2023.02); *H10K 59/80* (2023.02); *H10K*
                   *59/8731* (2023.02)

(58) Field of Classification Search
    CPC ... H10K 59/80; H10K 59/8731; H10K 59/122
    See application file for complete search history.

(56) References Cited

U.S. PATENT DOCUMENTS

| | | |
|---|---|---|
| 2021/0028249 A1 | 1/2021 | Ding et al. |
| 2022/0093894 A1 | 3/2022 | Song et al. |

FOREIGN PATENT DOCUMENTS

| | | | | |
|---|---|---|---|---|
| CN | 109935621 A | 6/2019 | | |
| CN | 110246984 A | 9/2019 | | |
| CN | 110265583 A | 9/2019 | | |
| CN | 110890406 A | 3/2020 | | |
| CN | 111261799 A | 6/2020 | | |
| CN | 111293155 A | 6/2020 | | |
| CN | 111312923 A | 6/2020 | | |
| CN | 112103326 A | * 12/2020 | ......... | H10K 59/1315 |

* cited by examiner

DISPLAY SUBSTRATE, PREPARATION METHOD THEREOF, AND DISPLAY DEVICE

CROSS-REFERENCE TO RELATED APPLICATION

The present application is a U.S. National Phase Entry of International Application No. PCT/CN2021/088803 having an international filing date of Apr. 21, 2021, the entire content of which is hereby incorporated by reference.

TECHNICAL FIELD

Embodiments of the present disclosure relate to, but are not limited to, the field of display technology, in particular to a display substrate and a preparation method thereof, and a display device.

BACKGROUND

An Organic Light Emitting Diode (OLED) is an active light emitting display device, which has advantages such as self-luminescence, wide angle of view, high contrast, low power consumption, high response speed, lightness and thinness, flexibility, and low cost. With the continuous development of the display technologies, flexible display devices with OLEDs being light emitting devices and signals being controlled by Thin Film Transistors (TFTs) have become the mainstream products in the field of display.

SUMMARY

The below is a summary about the subject matter described in the present disclosure in detail. The summary is not intended to limit the scope of protection of the claims.

An embodiment of the present disclosure provides a display substrate, which includes a drive circuit layer arranged on a substrate and a light emitting structure layer arranged on a side of the drive circuit layer away from the substrate, the light emitting structure layer includes an anode, a pixel definition layer, an organic light emitting layer and a cathode arranged in sequence along a direction away from the substrate, and an auxiliary electrode and an organic light emitting block arranged in sequence along a direction away from the substrate; the pixel definition layer includes an anode opening and an electrode opening, the anode opening exposes the anode, the electrode opening exposes the auxiliary electrode, the organic light emitting block is separated from the organic light emitting layer, the auxiliary electrode includes a first auxiliary electrode, a second auxiliary electrode on a side of the first auxiliary electrode away from the substrate, and a third auxiliary electrode on a side of the second auxiliary electrode away from the substrate.

The cathode includes a first horizontal lapping part and a second sidewall lapping part, the first horizontal lapping part laps with the first auxiliary electrode, the second sidewall lapping part laps with the second auxiliary electrode, and a thickness of the second sidewall lapping part in a direction parallel to the substrate is greater than that of the first horizontal lapping part in a direction perpendicular to the substrate.

In an exemplary embodiment, the second sidewall lapping part is connected with the first auxiliary electrode, the second sidewall lapping part is in contact with a surface of the third auxiliary electrode close to the substrate, and the second sidewall lapping part is connected with the first horizontal lapping part.

In an exemplary embodiment, the organic light emitting layer is arranged on a side of the first auxiliary electrode away from the substrate, the organic light emitting layer is separated from the second auxiliary electrode, the cathode also includes a first sidewall lapping part which laps with a side of the organic light emitting layer, and the cathode also laps with a side of the organic light emitting layer away from the substrate.

In an exemplary embodiment, the cathode further includes a second horizontal lapping part and a third lapping part, the second horizontal lapping part laps with a surface of a part of the third auxiliary electrode protruding from the second auxiliary electrode on a side close to the side of the substrate, the third lapping part laps with a side surface and a surface of a side of the organic light emitting block away from the substrate and a side surface of the third auxiliary electrode, and the second horizontal lapping part is connected with the third lapping part.

In an exemplary embodiment, a thickness of the third lapping part in a direction perpendicular to the substrate is greater than that of the second sidewall lapping part in a direction parallel to the substrate, and a thickness of the first sidewall lapping part in a direction parallel to the substrate is greater than that of the first horizontal lapping part in a direction perpendicular to the substrate.

In an exemplary embodiment, a thickness of the second sidewall lapping part in a direction parallel to the substrate is 500 angstroms to 3000 angstroms, and a thickness of the first horizontal lapping part in a direction perpendicular to the substrate is 100 angstroms to 1500 angstroms.

In an exemplary embodiment, the second auxiliary electrode includes a bottom surface close to the substrate and a top surface far away from the substrate, and a side surface between the top surface and the bottom surface, an angle formed by the side surface of the second auxiliary electrode and the bottom surface of the second auxiliary electrode is less than 90° in a plane perpendicular to the substrate.

In an exemplary embodiment, the anode includes a first anode layer, a second anode layer arranged on a side of the first anode layer away from the substrate, and a third anode layer arranged on a side of the second anode layer away from the substrate, an orthographic projection of the second anode layer on the substrate is within a range of an orthographic projection of the first anode layer on the substrate, and the orthographic projection of the second anode layer on the substrate is within a range of an orthographic projection of the third anode layer on the substrate.

In an exemplary embodiment, the first anode layer and the first auxiliary electrode are arranged in a same layer and made of a same material; the second anode layer and the second auxiliary electrode are arranged in a same layer and made of a same material; the third anode layer and the third auxiliary electrode are arranged in a same layer and made of a same material.

In an exemplary embodiment, the first anode layer has a first end and a second end in a second direction, and the second anode layer has a third end and a fourth end, a size of the first end in a first direction is smaller than that of the second end in the first direction, a size of the third end in the first direction is smaller than that of the fourth end in the first direction, the auxiliary electrode is arranged between the first end and the third end, and the first direction intersects the second direction.

In an exemplary embodiment, the first anode layer has a portion closer to a second pixel unit than the first end in the first direction; the second anode layer has a portion closer to a first pixel unit than the third end in the first direction, and the first pixel unit is adjacent to the second pixel unit.

In an exemplary embodiment, the drive circuit layer includes a transistor and a power electrode arranged on a substrate, a passivation layer arranged on a side of the transistor and the power electrode away from the substrate, and a flat layer arranged on a side of the passivation layer away from the substrate, the flat layer has an anode via and an electrode via, and the power electrode and a drain electrode in the transistor are arranged in a same layer; the passivation layer is provided with a first via and a second via, the first via exposes the drain electrode of the transistor and the second via exposes the power electrode; the anode via exposes the first via, and the electrode via exposes the second via.

In an exemplary embodiment, the first auxiliary electrode is connected with the power electrode through the electrode via and the second via, the second auxiliary electrode is in direct contact with the first auxiliary electrode, an orthographic projection of the second auxiliary electrode on the substrate is within a range of an orthographic projection of the third auxiliary electrode on the substrate, and the orthographic projection of the second auxiliary electrode on the substrate is within a range of an orthographic projection of the first auxiliary electrode on the substrate.

In an exemplary embodiment, an orthographic projection of the second via on the substrate is within a range of an orthographic projection of the electrode via on the substrate, and the orthographic projection of the second via on the substrate is within a range of an orthographic projection of the third auxiliary electrode on the substrate.

In an exemplary embodiment, an orthographic projection of the electrode opening on the substrate is within a range of an orthographic projection of the first auxiliary electrode on the substrate.

In an exemplary embodiment, a plurality of the anodes are arranged in a row along a first direction, anode vias corresponding to the anodes in a same row are arranged on a same straight line extending along the first direction, an electrode via corresponding to at least one connecting electrode overlaps with an anode via in a second direction, and the second direction intersects the first direction.

An embodiment of the present disclosure further provides a display device, including the display substrate as described in any one of the above.

An embodiment of the present disclosure further provides a method for preparing a display substrate, including:

forming a drive circuit layer on a base substrate;

forming a light emitting structure layer on the drive circuit layer, the light emitting structure layer includes an anode, a pixel definition layer, an organic light emitting layer and a cathode which are arranged in sequence along a direction away from the substrate, and an auxiliary electrode and an organic light emitting block which are arranged in sequence along a direction away from the substrate; the pixel definition layer includes an anode opening and an electrode opening, the anode opening exposes the anode, the electrode opening exposes the auxiliary electrode, the organic light emitting block is separated from the organic light emitting layer, the auxiliary electrode includes a first auxiliary electrode, a second auxiliary electrode on a side of the first auxiliary electrode away from the substrate, and a third auxiliary electrode on a side of the second auxiliary electrode away from the substrate; the cathode includes a first horizontal lapping part and a second sidewall lapping part, the first horizontal lapping part laps with the first auxiliary electrode, the second sidewall lapping part laps with the second auxiliary electrode, and a thickness of the second sidewall lapping part in a direction parallel to the substrate is greater than that of the first horizontal lapping part in a direction perpendicular to the substrate.

After reading and understanding the drawings and the detailed description, other aspects may be understood.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure but not intended to form limits to the technical solutions of the present disclosure. The shapes and sizes of each component in the drawings do not reflect the true scale, but are only intended to schematically describe the contents of the present disclosure.

FIG. 5b is an enlarged structural schematic diagram of a region A in FIG. 5a.

FIG. 6a is a schematic diagram obtained after a first conductive layer pattern is formed according to an embodiment of the present disclosure.

FIG. 6b is a sectional view taken along a direction A-A in FIG. 6a.

FIG. 7a is a schematic diagram obtained after a semiconductor layer pattern is formed according to an embodiment of the present disclosure.

FIG. 7b is a sectional view taken along a direction A-A in FIG. 7a.

FIG. 8a is a schematic diagram obtained after a second conductive layer pattern is formed according to an embodiment of the present disclosure.

FIG. 8b is a sectional view taken along a direction A-A in FIG. 8a.

FIG. 9b is a sectional view taken along a direction A-A in FIG. 9a.

FIG. 10b is a sectional view taken along a direction A-A in FIG. 10a.

FIG. 11b is a sectional view taken along a direction A-A in FIG. 11a.

FIG. 12a is a schematic diagram obtained after a first transparent conductive layer pattern is formed according to an embodiment of the present disclosure.

FIG. 12b is a sectional view taken along a direction A-A in FIG. 12a.

DETAILED DESCRIPTION

Figure 1:
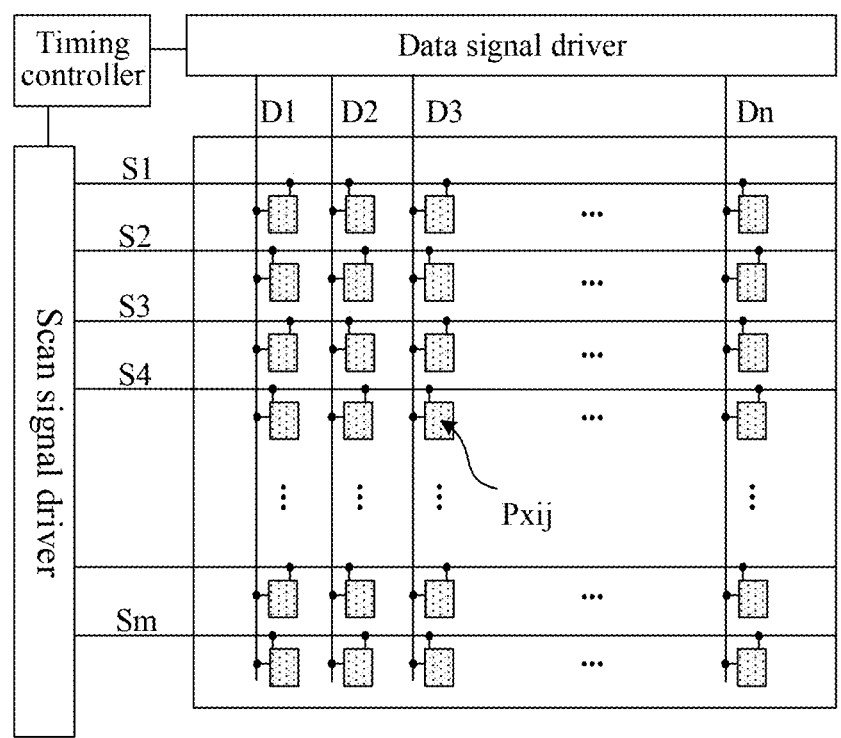
FIG. 1 is a schematic diagram of a structure of a display substrate.

To make the objects, technical solutions and advantages of the present disclosure more clear, embodiments of the present disclosure will be described in detail below with reference to the drawings. It is to be noted that implementations may be implemented in various forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and the features in the embodiments can be freely combined without conflicts.

In the drawings, sometimes for clarity, the size of the constituent elements, the thickness of the layer or the area may be exaggerated. Therefore, a mode of the present disclosure is not always limited to that size, and the shapes and sizes of various components in the drawings do not reflect the true scale. In addition, the drawings schematically illustrate ideal examples, and a mode of the present disclosure is not limited to the shapes, numerical values, or the like shown in the drawings.

"First", "second", "third" and other ordinal numerals in the specification are set to avoid the confusion of the constituent elements, rather than to limit the quantity.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the device or element referred to must have a specific orientation or be constructed and operated in a specific orientation, so they should not be understood as limitations to the present disclosure. The position relationship between the constituent elements may be appropriately varied according to the direction of the described constituent elements. Therefore, appropriate replacements based on situations are allowed, not limited to the expressions in the specification.

Unless otherwise specified and limited, in the specification the terms "mount", "connected" and "connect" should be understood in a broad sense. For example, it may be fixed connection, removable connection, or integrated connection; it may be mechanical connection or electrical connection; it may be direct connection, indirect connection through an intermediate component, or communication inside two components. For those skilled in the art, the specific meanings of the above terms in the present disclosure can be understood according to the actual situation.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the present specification, the channel region refers to a main region that the current flows through.

In the present specification, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification.

In this specification, an "electrical connection" includes a case where constituent elements are connected together through an element with a certain electric action. "The element with the certain electric action" is not particularly limited as long as electric signals between the connected composition elements may be sent and received. Examples of "the element with the certain electric action" not only include an electrode and wire, but also include a switch element (such as a transistor), a resistor, an inductor, a capacitor, other elements with various functions, etc.

In the specification, "parallel" refers to a state in which an angle formed by two straight lines is more than −10° and less than 10°. Thereby, it also includes a state in which an angle is more than −5° and less than 5°. In addition, "vertical" refers to a state in which an angle formed by two straight lines is more than 80° and less than 100°. Therefore, it also includes a state in which an angle is more than 85° and less than 95°.

In this specification, "film" and "layer" may be interchangeable. For example, sometimes "conducting layer" may be replaced by "conducting film". Similarly, sometimes "insulating film" may be replaced by "insulating layer".

In the present disclosure, "about" refers to that a boundary is defined not so strictly and numerical values in process and measurement error ranges are allowed.

FIG. 1 illustrates a schematic diagram of a structure of a display device. As shown in FIG. 1, an OLED display device may include a timing controller, a data driver, a scan driver, and a pixel array, the pixel array may include multiple scanning lines (S1 to Sm), multiple data lines (D1 to Dn), and multiple sub-pixels Pxij. In an exemplary embodiment, the timing controller may provide a control signal and a gray scale value suitable for the specification of the data driver to the data driver, and may provide a scan start signal, a clock signal suitable for the specification of the scan driver and the like to the scan driver. The data driver may generate data voltages to be provided to the data lines D1, D2, D3 . . . and Dn using gray scale values and control signals received from the timing controller. For example, the data driver may sample the gray scale values by using the clock signal, and apply the data voltages corresponding to the gray scale values to the data lines D1 to Dn by using a sub-pixel row as a unit, wherein n may be a natural number. The scan driver may generate scan signals to be provided to the scanning lines S1, S2, S3 . . . and Sm by receiving the clock signal, the scan start signal, and the like from the timing controller. For example, the scan driver may sequentially provide the scan signals with on-level pulses to the scanning lines S1 to Sm. For example, the scan driver may be in form of a shift register, and may sequentially transmit the scan starting signal provided in form of an on-level pulse to a next-stage circuit to generate the scan signal under the control of the clock signal. Herein, m may be a natural number. The sub-pixel array may include multiple sub-pixels PXij. Each sub-pixel PXij may be connected to a corresponding data line and a corresponding scanning line, wherein i and j may be natural numbers. The sub-pixel PXij may refer to a sub-pixel of which a transistor is connected to an ith scanning line and a jth data line.

Figure 2:
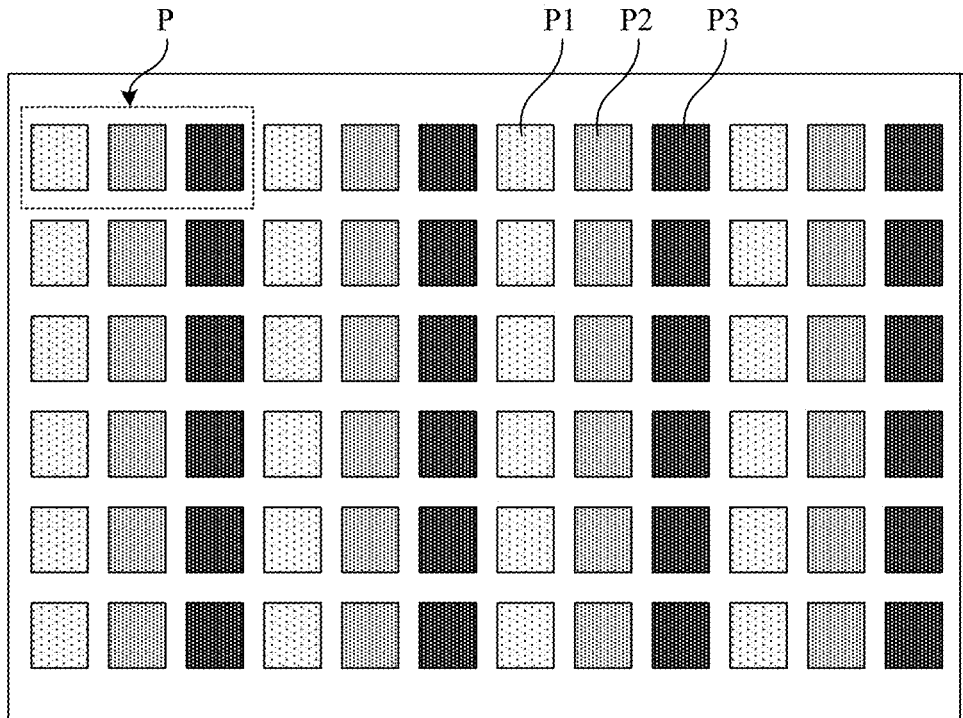
FIG. 2 illustrates a schematic diagram of a planar structure of a display substrate.

FIG. 2 illustrates a schematic diagram of a planar structure of a display substrate. As shown in FIG. 2, the display substrate may include multiple pixel units P arranged in a matrix, at least one of the multiple pixel units P includes a first light emitting unit (sub-pixel) P1 that emits light of a first color, a second light emitting unit P2 that emits light of a second color, and a third light emitting unit P3 that emits light of a third color, the first light emitting unit P1, the second light emitting unit P2, and the third light emitting unit P3 each include a pixel drive circuit and a light emitting device. The pixel drive circuits in the first light emitting unit P1, the second light emitting unit P2, and the third light emitting unit P3 are respectively connected to scanning lines, data lines, and light emitting signal lines, the pixel drive circuits are configured to receive the data voltages transmitted by the data lines and output corresponding currents to the light emitting devices under the control of the scanning lines and the light emitting signal lines. The light emitting devices in the first light emitting unit P1, the second light emitting unit P2, and the third light emitting unit P3 are respectively connected to the pixel drive circuits of the light emitting units, and the light emitting devices are configured to emit light of corresponding brightness in response to the current outputs by the pixel drive circuits of the corresponding light emitting units.

In an exemplary embodiment, a pixel unit P may include a red (R) light emitting unit, a green (G) light emitting unit, and a blue (B) light emitting unit, or may include a red light emitting unit, a green light emitting unit, a blue light emitting unit, and a white light emitting unit, which is not limited in the present disclosure. In an exemplary embodiment, a shape of a light emitting unit in the pixel unit may be a rectangle, a rhombus, a pentagon, or a hexagon. When the pixel unit includes three light emitting units, the three light emitting units may be arranged in parallel horizontally, in parallel vertically, or in a manner like a Chinese character "品". When the pixel unit includes four light emitting units, the four light emitting units may be arranged in parallel horizontally, in parallel vertically, or a square shape, which is not limited in the present disclosure.

Figure 3:
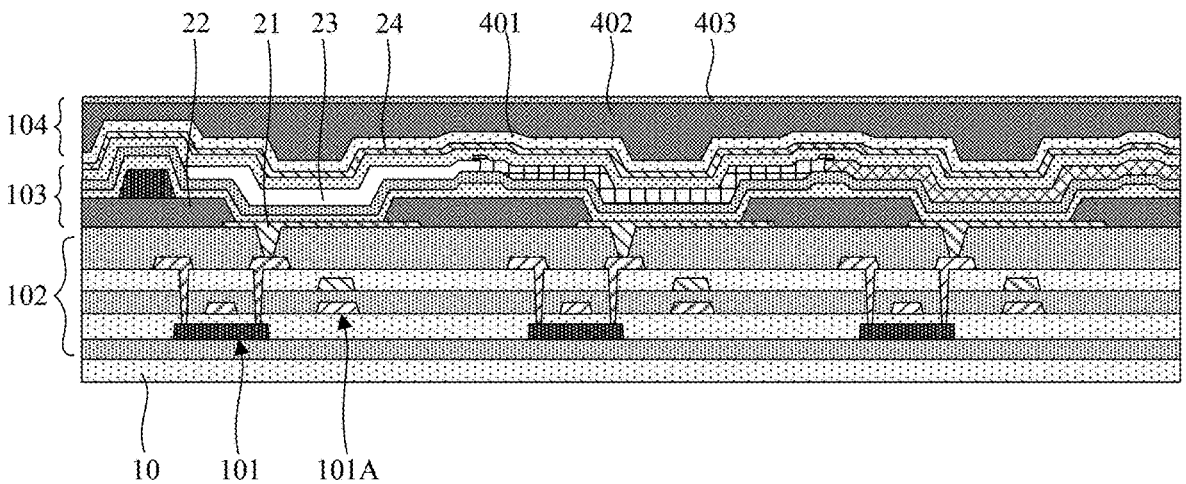
FIG. 3 illustrates a schematic diagram of a sectional structure of a display substrate.

FIG. 3 is a schematic diagram of a sectional structure of a display substrate, showing a structure of three sub-pixels in an OLED display substrate. Referring to FIG. 3, on a plane perpendicular to the display substrate, the display substrate may include a drive circuit layer 102 disposed on a base substrate 10, a light emitting structure layer 103 disposed on a side of the drive circuit layer 102 away from the base substrate 10, and an encapsulation layer 104 disposed on a side of the light emitting structure layer 103 away from the base substrate 10. In some possible embodiments, the display substrate may include other film layers, such as post spacers, which is not limited in the present disclosure.

In an exemplary embodiment, the base 10 may be a flexible base or may be a rigid base. The drive circuit layer 102 of each sub-pixel may include multiple transistors and storage capacitors forming a pixel drive circuit. In FIG. 3, illustration is made by taking each sub-pixel including one transistor 101 and one storage capacitor 101A as an example. The light emitting structure layer 103 may include an anode 301, a pixel definition layer 302, an organic light emitting layer 303 and a cathode 304, the anode 301 is connected to a drain electrode of the transistor 101 through a via, the organic light emitting layer 303 is connected to the anode 301, the cathode 304 is connected to the organic light emitting layer 303, the organic light emitting layer 303 emits light of a corresponding color under driving of the anode 301 and the cathode 304. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

Figure 4:
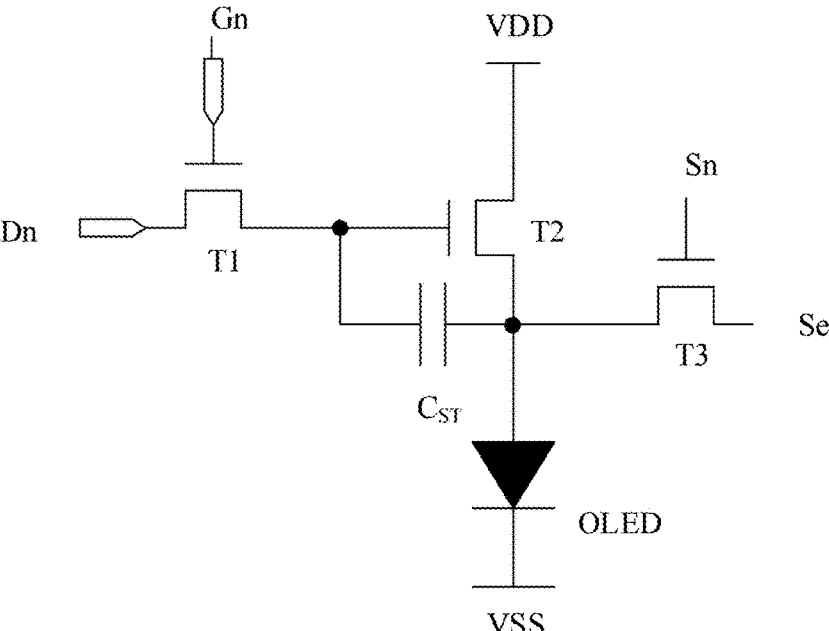
FIG. 4 is a schematic diagram of an equivalent circuit of a pixel drive circuit.

In an exemplary implementation, the pixel drive circuit may have a structure of 3T1C, 4T1C, 5T1C, 5T2C, 6T1C or 7T1C. FIG. 4 illustrates a schematic diagram of an equivalent circuit of a pixel drive circuit. As shown in FIG. 4, the pixel drive circuit has a 3T1C structure, which may include three switching transistors (a first transistor T1, a second transistor T2, and a third transistor T3), one storage capacitor $C_{ST}$, and six signal lines (a data line Dn, a first scanning line Gn, a second scanning line Sn, a compensation line Se, a first power supply line VDD, and a second power supply line VSS). In an exemplary embodiment, the first transistor T1 is a switching transistor, the second transistor T2 is a drive transistor, and the third transistor T3 is a compensation transistor. A gate electrode of the first transistor T1 is coupled to the first scanning line Gn, a first electrode of the first transistor T1 is coupled to the data line Dn, a second electrode of the first transistor T1 is coupled to a gate electrode of the second transistor T2. The first transistor T1 is configured to receive a data signal transmitted by the data line Dn under the control of the first scanning line Gn, so that the gate electrode of the second transistor T2 receives the data signal. The gate electrode of the second transistor T2 is coupled to the second electrode of the first transistor T1, a first electrode of the second transistor T2 is coupled to the first power supply line VDD, a second electrode of the second transistor T2 is coupled to a first electrode of an OLED, and the second transistor T2 is configured to generate a corresponding current at the second electrode under the control of the data signal received by the gate electrode of the second transistor. A gate electrode of the third transistor T3 is coupled to the second scanning line Sn, a first electrode of the third transistor T3 is connected to the compensation line Se, a second electrode of the third transistor T3 is coupled to the second electrode of the second transistor T2. The third transistor T3 is configured to extract a threshold voltage Vth and the mobility of the second transistor T2 in response to compensation timing to compensate the threshold voltage Vth. The first electrode of the OLED is coupled to the second electrode of the second transistor T2, a second electrode of the OLED is coupled to the second power supply line VSS, and the OLED is configured to emit light with corresponding brightness in response to the current of the second electrode of the second transistor T2. A first electrode of the storage capacitor $C_{ST}$ is coupled to the gate electrode of the second transistor T2, a second electrode of the storage capacitor $C_{ST}$ is coupled to the second electrode of the second transistor T2, and the storage capacitor $C_{ST}$ is configured to store a potential of the gate electrode of the second transistor T2.

In an exemplary embodiment, a signal of the first power supply line VDD is a high-level signal continuously provided, and a signal of the second power supply line VSS is a low-level signal. The first transistor T1 to the third transistor T3 may be P-type transistors or may be N-type transistors. Using the same type of transistors in the pixel drive circuit can simplify the process flow, reduce the process difficulty of the display panel, and improve the yield of the product. In some possible implementations, the first transistor T1 to the third transistor T3 may include a P-type transistor and an N-type transistor. In an exemplary embodiment, the light emitting device may be an Organic Light Emitting Diode (OLED), including a first electrode (anode), an organic light emitting layer, and a second electrode (cathode) which are stacked.

According to a light emitting direction, the OLED display substrates may be classified into three types, including a bottom emission OLED, a top emission OLED, and a double-sided emission OLED. The bottom emission OLED emits light from the bottom direction of the substrate, and the top emission OLED emits light from the top direction of the substrate. The double-sided emission OLED emits light from both the bottom direction of the substrate and the top direction of the substrate. Compared with the bottom emission OLED, the top emission OLED has advantages such as high aperture ratio, high color purity, and easiness in achieving high resolution, i.e., pixels per inch (PPI), and thus attracts much attention of people.

For the top emission OLED, since the light emission direction is on a side of the cathode, the cathode is required to have good light transmittance and conductivity, but it is very difficult to satisfy the requirements on the light transmittance and conductivity simultaneously. For example, in order to satisfy the requirements on the conductivity, the thickness of the cathode is necessarily required to be relatively large, but the transmittance of the cathode is relatively low in this case, leading to a problem of a view angle color cast. In order to satisfy the requirement on the light transmittance, the thickness of the cathode is necessarily required to be relatively small, but the impedance of the cathode is relatively large in this case, not only leading to problems of increase of voltage and power consumption, but also leading to problems of uneven voltage distribution at different positions on the cathode and uneven brightness.

In a top emission OLED display substrate, in order to reduce a cathode voltage drop, an auxiliary electrode is employed to reduce the impedance of the cathode, so as to reduce the cathode voltage drop. In the display substrate, the auxiliary electrode is disposed on the drive circuit layer, the cathode is disposed on the light emitting structure layer, and a via is formed in the drive circuit layer and the light emitting structure layer by a laser process, so that the cathode is connected to the auxiliary electrode by the via. Since a large number of particles are produced in the laser process for forming the via in the organic light emitting layer, the structure and process seriously affect the product yield. The structure and process greatly reduce the production efficiency since the use of the laser process increases the tact time. Since a via formed by the laser process is relatively small and a contact area between the cathode and the auxiliary electrode is relatively small, the structure and process cannot effectively reduce the cathode voltage drop, thus affecting the display effect.

Figure 5A:
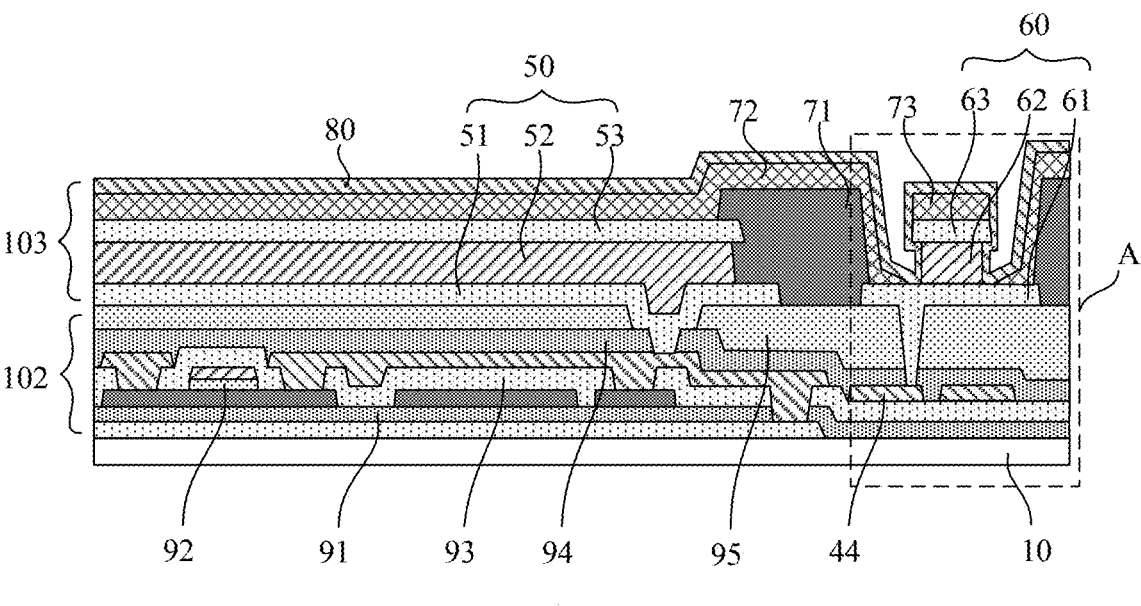
FIG. 5a is a schematic diagram of a structure of a display substrate according to an embodiment of the present disclosure.
Figure 5B:
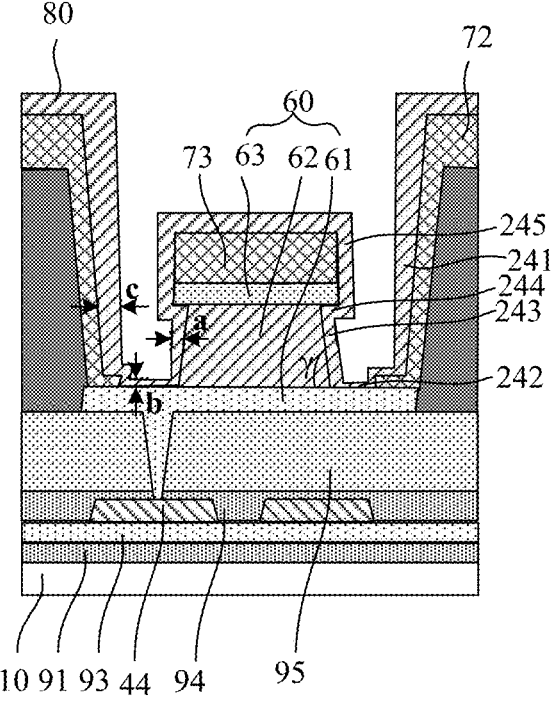

FIG. 5a is a schematic diagram of a structure of a display substrate according to an exemplary embodiment of the present disclosure, which illustrates a sectional structure of one sub-pixel in the display substrate, and FIG. 5b is an enlarged schematic diagram of the structure of the region A in FIG. 5a. As shown in FIGS. 5a and 5b, in an exemplary embodiment, in a plane perpendicular to the display substrate, the display substrate may include a drive circuit layer 102 disposed on the substrate 10 and a light emitting structure layer 103 disposed on a side of the drive circuit layer 102 away from the substrate. The drive circuit layer 102 may include the second power supply line 44, and transistors and storage capacitors constituting a pixel drive circuit, the light emitting structure layer 103 may include the anode 50, the auxiliary electrode 60, the pixel definition layer 71, the organic light emitting layer 72 and the cathode 80, the organic light emitting layer 72 is connected with the anode 50 and the cathode 80 respectively, the auxiliary electrode 60 is connected with the second power supply line 44, and the cathode 80 is connected with the auxiliary electrode 60. The auxiliary electrode 60 includes a bottom surface close to the substrate, a top surface far away from the substrate, and a side surface arranged between the bottom surface and the top surface, and the cathode 80 is in contact with the side surface of the auxiliary electrode 60.

In an exemplary embodiment, in a plane perpendicular to the display substrate, an auxiliary electrode 60 may include a first auxiliary electrode 61, a second auxiliary electrode 62 disposed on a side of the first auxiliary electrode 61 away from the substrate, and a third auxiliary electrode 63 disposed on a side of the second auxiliary electrode 62 away from the substrate, the first auxiliary electrode 61, the second auxiliary electrode 62 and third auxiliary electrode 63 which are stacked form a structure with a shape like a Chinese character " 工 ", a whole orthographic projection of the second auxiliary electrode 62 on the substrate is within the range of orthographic projections of the first auxiliary electrode 61 and the third auxiliary electrode 63 on the substrate.

In an exemplary embodiment, a light emitting structure layer 102 may include an organic light emitting block 73, and the organic light emitting block 73 and the organic light emitting layer 72 are arranged in the same layer, made of the same material, and simultaneously formed by the same evaporation process. In an exemplary embodiment, the organic light emitting block 73 is disposed on a side of the auxiliary electrode 60 away from the substrate, and the organic light emitting block 73 is disposed separately from the organic light emitting layer 72.

In an exemplary embodiment, an organic light emitting block 73 is disposed on a side of a third auxiliary electrode 63 away from the substrate, and an orthographic projection of the organic light emitting block 73 on the substrate is within the range of the orthographic projection of the third auxiliary electrode 63 on the substrate.

In an exemplary embodiment, in a plane perpendicular to the display substrate, an anode 50 may include a first anode 51, a second anode 52 disposed on a side of the first anode 51 away from the substrate, and a third anode 53 disposed on a side of the second anode 52 away from the substrate, the first anode 51, the second anode 52, and third anode 53 which are stacked form a structure with a shape like a Chinese character " 工 ", and a whole orthographic projection of the second anode 52 on the substrate is within the range of orthographic projections of the first anode 51 and the third anode 53 on the substrate.

In an exemplary embodiment, a first auxiliary electrode 61 and a first anode 51 are disposed in a same layer, are made of a same material, and are formed simultaneously through a same patterning process.

In an exemplary embodiment, a second auxiliary electrode 62 and a second anode 52 are disposed in a same layer, are made of a same material, and are formed simultaneously through the same patterning process.

In an exemplary embodiment, a third auxiliary electrode 63 and a third anode 53 are disposed in a same layer, are made of a same material, and are formed simultaneously through the same patterning process.

In an exemplary embodiment, a drive circuit layer 102 may include a first conductive layer disposed on the substrate 10, a first insulating layer 91 covering the first conductive layer, a semiconductor layer disposed on the first insulating layer 91, a second insulating layer 92 disposed on the semiconductor layer, a second conductive layer disposed on the second insulating layer 92, a third insulating layer 93 covering the second conductive layer, a third conductive layer disposed on the third insulating layer 93, a fourth insulating layer 94 covering the third conductive layer, and a flat layer 95 disposed on the fourth insulating layer 94. The first conductive layer at least includes a shielding layer, the semiconductor layer at least includes a first capacitor plate and active layers of a plurality of transistors, the second conductive layer at least includes gate electrodes of a plurality of transistors, the third conductive layer at least includes a second power supply line, a second capacitor plate and first and second electrodes of a plurality of transistors, the second capacitor plate is connected with the shielding layer through via, the second capacitor plate and the first capacitor plate form a first storage capacitor, and the shielding layer and the first capacitor plate form a second storage capacitor. The fourth insulating layer 94 and the flat layer 95 are provided with anode vias and electrode vias, an anode is connected with the second capacitor plate through an anode via, and an auxiliary electrode is connected with the second power supply line through an electrode via.

In an exemplary embodiment, a pixel definition layer 71 in a light emitting structure layer 103 is provided with a first pixel opening and a second pixel opening, the first pixel opening exposes part of a surface of the third anode 53, and the second pixel opening exposes the second auxiliary electrode 62 and the third auxiliary electrode 63.

In an exemplary embodiment, a cathode 80 in a light emitting structure layer 103 realizes a large-area contact connection between the cathode 80 and an auxiliary electrode 60 by wrapping an organic light emitting block 73 and the auxiliary electrode 60.

In an exemplary embodiment, for a first auxiliary electrode 61, a second auxiliary electrode 62, a third auxiliary electrode 63 and an organic light emitting block 73 which are stacked in a direction far away from the substrate, exposed surfaces of an organic light emitting block 73 include: an upper surface away from the substrate and a side surface on a side part, exposed surfaces of the third auxiliary electrode 63 include: a third side surface on a side part and the third lower surface of a part protruding from the second auxiliary electrode 62 on a side close to the substrate, and an exposed surface of the second auxiliary electrode 62 includes: a second side surface on a side part. In an exemplary embodiment, side surfaces refer to multiple circumferential surfaces each having a normal direction being parallel or nearly parallel to a plane of the base substrate. The cathode 80 wrapping the organic light emitting block 73 and the auxiliary electrode 60 means that the cathode 80 covers or partially covers the upper surface and all side surfaces of the organic light emitting block 73, the cathode 80 covers or partially covers all third side surfaces and the third lower surface of the third auxiliary electrode 63, and the cathode 80 completely covers or partially covers all second side surfaces of the second auxiliary electrode 62.

In an exemplary embodiment, as shown in FIG. 5b, the cathode 80 includes a first horizontal lapping part 242 and a second sidewall lapping part 243, the first horizontal lapping part 242 laps with a first auxiliary electrode 61 and the second sidewall lapping part 243 laps with the second auxiliary electrode 62, and the thickness a of the second sidewall lapping part 243 in the first direction is greater than the thickness b of the first horizontal lapping part 242 in the second direction. In an embodiment in the disclosure, the first direction may be a direction parallel to the substrate, and the second direction may be a direction perpendicular to the substrate. Therefore, by the embodiments of the present disclosure, supporting force of the auxiliary electrode in a shape like a Chinese character " 工 " can be enhanced, and effective contact areas between the second sidewall lapping part 243 and the third lower surface of the lower side of the third auxiliary electrode 63, and between the second sidewall lapping part 243 and the first auxiliary electrode 61 located at the bottom surface of the electrode via K2 can be increased, so that the second sidewall lapping part 243 has more stable supporting ability, improves the stability of supporting lapping, and further improves the reliability of the auxiliary cathode.

In an exemplary embodiment, as shown in FIG. 5b, the cathode 80 further includes a first sidewall lapping part 241, and the thickness c of the first sidewall lapping part 241 in the first direction is greater than the thickness b of the first horizontal lapping part 242 in the second direction.

In an exemplary embodiment, as shown in FIG. 5b, the thickness a of the second sidewall lapping part 243 in the first direction is 500 angstroms (A) to 3000 angstroms. The larger the thickness a of the second sidewall lapping part 243 in the first direction, the larger the contact areas between the second sidewall lapping part 243 and the third lower surface of the lower side of the third auxiliary electrode 63 and between the second sidewall lapping part 243 and the first auxiliary electrode 61 located at the bottom surface of the electrode via K2, and the stronger the adhesive force formed therebetween, so the stronger the mechanical support and connection stability formed by the auxiliary electrode. In addition, the thicker the lapping thickness of the second sidewall lapping part 243, the smaller the resistance of the second sidewall lapping part 243 itself, further, the resistance of the entire auxiliary electrode can be reduced, and the electrical performance can be improved.

For example, as shown in FIG. 5b, the thickness a of the second sidewall lapping part 243 in the first direction may be 700 angstroms.

In an exemplary embodiment, as shown in FIG. 5b, the thickness b of the first horizontal lapping part 242 is 100 to 1500 angstroms, so that the resistance value of the first horizontal lapping part 242 can be maller and the electrical performance is better, and the thicker the first horizontal lapping part 242, the stronger the lapping strength, and the lapping effect is less likely to fail, which is conducive to the improvement of the reliability of the auxiliary cathode. In addition, the thicker the thickness of the first horizontal lapping part 242, the better the lapping effect with the first sidewall lapping part 241.

For example, as shown in FIG. 5b, the thickness b of the first horizontal lapping part 242 may be 300 angstroms.

In an exemplary embodiment, as shown in FIG. 5b, the first horizontal lapping part 242 laps with the first auxiliary electrode 61 located at the bottom surface of the electrode via K2, so that both the first auxiliary electrode 61 and the second auxiliary electrode 62 lap with the cathode 24, therefore, on the one hand, the bonding performance between the first auxiliary electrode 61 and the second auxiliary electrode 62 is better, and on the other hand, the resistance of the whole auxiliary electrode is also reduced.

In an exemplary embodiment, as shown in FIG. 5b, the cathode 80 further includes a second horizontal lapping part 244 and a third lapping part 245, the second horizontal lapping part 244 laps with the surface of a part of the third auxiliary electrode 63 protruding from the second auxiliary electrode 62 on a side close to the substrate, the third lapping part 245 laps with a side surface and a surface of a side of the organic light emitting block 73 away from the substrate and a side surface of the third auxiliary electrode 63, and the second horizontal lapping part 244 is connected with the third lapping part 245.

In an exemplary embodiment, as shown in FIG. 5b, the thickness of the third lapping part 245 in the direction perpendicular to the substrate is greater than that of the second sidewall lapping part 243 in the direction parallel to the substrate, and the thickness of the first sidewall lapping part 241 in the direction parallel to the substrate is greater than that of the first horizontal lapping part 242 in the direction perpendicular to the substrate.

In an exemplary embodiment, as shown in FIG. 5b, the second auxiliary electrode 62 includes a bottom surface close to the substrate and a top surface far away from the substrate, and a side surface between the top surface and the bottom surface, in a plane perpendicular to the substrate, the angle γ formed by the side surface of the second auxiliary electrode 62 and the bottom surface of the second auxiliary electrode 62 is less than 90°.

In an exemplary embodiment, in a plane parallel to the display substrate, the shape of the auxiliary electrode 60 may be any one or more of the following: triangle, rectangle, trapezoid, polygon, circle and ellipse.

In an exemplary embodiment, in a plane parallel to the display substrate, the display substrate includes a plurality of pixel units, and the auxiliary electrode may be disposed between anodes of adjacent pixel units.

The process of preparing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials. Deposition may be implemented by adopting any one or more of sputtering, evaporation and chemical vapor deposition. Coating may be implemented by adopting any one or more of spray coating, spin coating and inkjet printing, and etching may be implemented by adopting any one or more of dry etching and wet etching, which are not limited in the present disclosure. "Thin film" refers to a layer of thin film formed by a certain material on a base through deposition, coating or other processes. If a "thin film" does not need a patterning process in the whole preparing process, the "thin film" may also be called a "layer". If a "thin film" needs a patterning process in the whole preparing process, it is called "thin film" before the patterning process and "layer" after the patterning process. A "layer" obtained after a patterning process includes at least one "pattern". "A and B are disposed in the same layer" in the present disclosure means that A and B are formed at the same time through the same patterning process, and the "thickness" of the film layer is the size of the film layer in a direction perpendicular to the display substrate. In an exemplary embodiment of the present disclosure, "an orthographic projection of B is within the range of an orthographic projection of A" refers to the boundary of the orthographic projection of B falling within the boundary range of the orthographic projection of A, or the boundary of the orthographic projection of A overlaps with the boundary of the orthographic projection of B.

In an exemplary embodiment, taking two pixel units (6 sub-pixels) of the display substrate as an example, the preparation process of the display substrate may include the following operations.

(1) A base substrate is provided. In an exemplary implementation, the base substrate may be a flexible base substrate or may be a rigid base substrate. In an exemplary embodiment, the flexible substrate may include a first flexible material layer, a first inorganic material layer, a semiconductor layer, a second flexible material layer, and a second inorganic material layer which are stacked. Materials of the first and second flexible material layers may be polyimide (PI), polyethylene terephthalate (PET), or a polymer soft film subjected to surface treatment, etc. Materials of the first and second inorganic material layers may be silicon nitride (SiNx), silicon oxide (SiOx), or the like, so as to improve water-oxygen resistance capability of the base substrate. The first and second inorganic material layers are also referred to as barrier layers. A material of the semiconductor layer may be amorphous silicon (a-si). In an exemplary embodiment, taking a stacked structure as an example, a manufacturing process thereof may include: first, coating a layer of polyimide on a glass carrier plate, and forming a first flexible (PI1) layer after curing for film formation; depositing a layer of barrier thin film on the first flexible layer to form a first barrier (Barrier 1) layer covering the first flexible layer; depositing a layer of amorphous silicon thin film on the first barrier layer to form an amorphous silicon (a-si) layer covering the first barrier layer; coating a layer of polyimide on the amorphous silicon layer, and forming a second flexible (PI2) layer after curing for film formation; and then depositing a layer of barrier thin film on the second flexible layer to form a second barrier (Barrier 2) layer covering the second flexible layer, till which the manufacturing of the base substrate is completed.

(2) A first conducting layer pattern is formed. In an exemplary embodiment, forming the first conductive layer pattern may include: depositing a first metal film on a substrate, patterning the first metal film through a patterning process, and forming the first conductive layer pattern on the substrate, the first conductive layer pattern at least includes a shielding layer 11, a power supply connection line 12, and a compensation connection line 13, as shown in FIGS. 6a and 6b, and FIG. 6b is a sectional view taken along a direction A-A in FIG. 6a.

In an exemplary embodiment, the shielding layer 11 is disposed in each sub-pixel, and may be a rectangular shape provided with protrusions or grooves. Power supply connection lines 12 are disposed in one pixel unit and extend to the first sub-pixel P1, the second sub-pixel P2 and the third sub-pixel P3 along the first direction D1 or the opposite direction of the first direction D1, power supply connection lines 12 between adjacent pixel units are disposed at intervals, power supply connection lines 12 are configured to connect the first power supply lines formed later and provide power signal for a pixel drive circuit of each sub-pixel of the pixel unit where it is located. Compensation connection lines 13 are arranged in one pixel unit and extend to the first sub-pixel P1, the second sub-pixel P2 and the third sub-pixel P3 along the first direction D1 or the opposite direction of the first direction D1, compensation connection lines 13 of two adjacent pixel units are connected with each other to form an integral structure, the compensation connection lines 13 are configured to connect compensation lines formed later and provide compensation signals for a pixel drive circuit of each sub-pixel of the pixel unit where it is located.

Figures 6A, 6B, 7A:
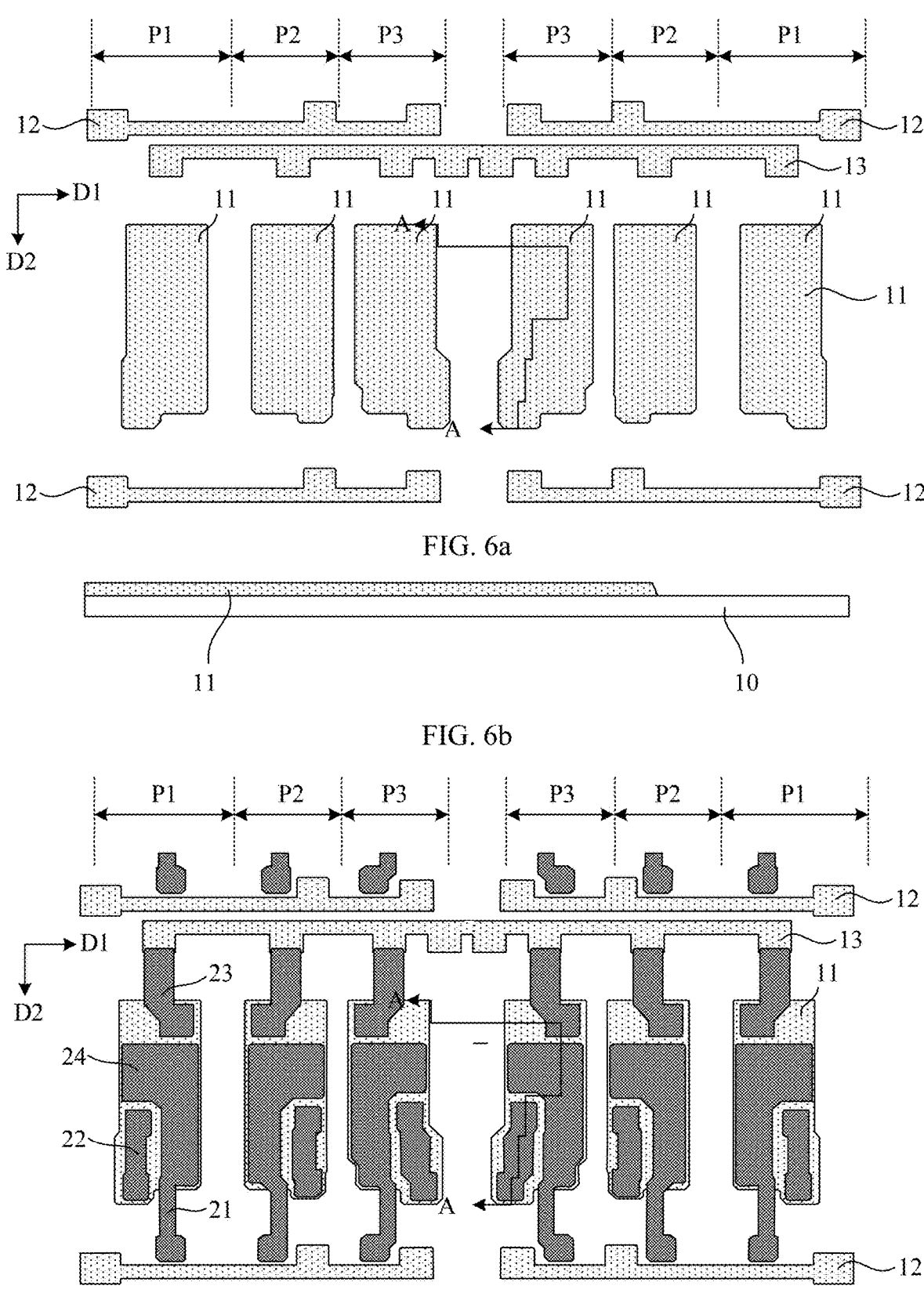

As shown in FIG. 6*b*, after this process, the display substrate includes a first conductive layer disposed on the substrate 10, and the first conductive layer at least includes the shielding layer 11.

Figures 7B, 8A, 8B:
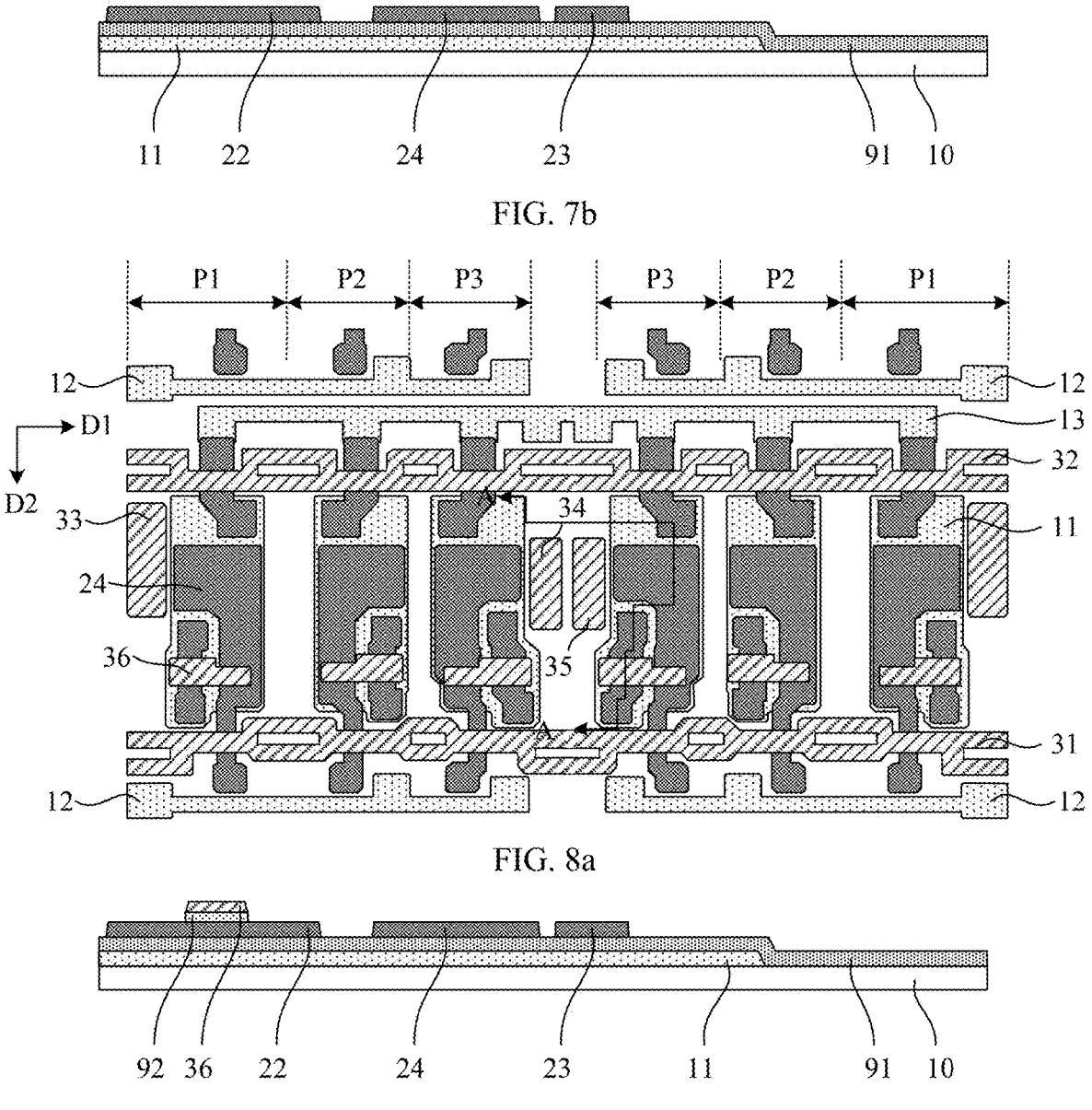

(3) A semiconductor layer pattern is formed. In an exemplary embodiment, forming the semiconductor layer pattern may include: sequentially depositing a first insulating film and a semiconductor film on the substrate on which the aforementioned pattern is formed, and patterning the semiconductor film through a patterning process to form a first insulating layer covering the first metal layer pattern and the semiconductor layer pattern disposed on the first insulating layer, the semiconductor layer pattern of each sub-pixel may include the first active layer 21 of the first transistor T1, the second active layer 22 of the second transistor T2, and the third active layer 23 of the third transistor T3 and the first capacitor plate 24, as shown in FIG. 7*a* and FIG. 7*b*, FIG. 7*b* is a sectional view taken along a direction A-A in FIG. 7*a*.

In an exemplary embodiment, the first active layer 21, the second active layer 22 and the third active layer 23 in each sub-pixel may all be in a shape of strip extending along the second direction D2 and arranged at intervals, the first capacitor plate 24 may be a rectangular shape provided with a protrusion or groove, the first active layer 21 and the first capacitor plate 24 are of an integral structure, connected to each other, and the orthographic projection of the second active layer 22 on the substrate is within the range of the orthographic projection of the shielding layer 11 on the substrate, and the orthographic projection of the first capacitor plate 24 on the substrate is within the range of the orthographic projection of the shielding layer 11 on the substrate.

As shown in FIG. 6*b*, after that process, the display substrate includes a first conductive layer disposed on the substrate 10, a first insulating layer 91 covering the first conductive layer, and a semiconductor layer disposed on the first insulating layer 91. The first conductive layer at least includes the shielding layer 11, and the semiconductor layer at least includes the second active layer 22, the third active layer 23 and the first capacitor plate 24.

(4) A second conductive layer pattern is formed. In an exemplary embodiment, forming a second conductive layer pattern may include: depositing a second insulating film and a second metal film successively on the substrate on which the aforementioned patterns are formed, patterning the second metal film and the second insulating film through a patterning process, forming patterns of a second insulating layer and a second conductive layer arranged on the second insulating layer, the second conductive layer pattern at least includes: the first scanning line 31, the second scanning line 32, the first protective electrode 33, the second protective electrode 34, the third protective electrode 35 and the second gate electrode 36, as shown in FIG. 8*a* and FIG. 8*b*, FIG. 8*b* is a sectional view taken along a direction A-A in FIG. 8*a*. In an exemplary embodiment, the second conductive layer may be referred to as a gate metal (GATE) layer.

In an exemplary embodiment, the first scanning line 31 and the second scanning line 32 extend along the first direction D1. An area where the first scanning line 31 overlaps with the first active layer 21 in each sub-pixel serves as a gate electrode of the first transistor T1 of the sub-pixel where it is located, and an area where the second scanning line 32 overlaps with the third active layer 23 in each sub-pixel serves as a gate electrode of the third transistor T3 of the sub-pixel where it is located. In an exemplary embodiment, areas other than those of the gate electrodes in the first scanning line 31 and the second scanning line 32 may be arranged in a double-wire structure to improve the reliability of signal transmission.

In an exemplary embodiment, a first protection electrode 33, a second protection electrode 34 and a third protection electrode 35 are all strip-shaped extending along the second direction D2. The first protection electrode 33 may be disposed in each pixel unit at a side of the first sub-pixel P1 away from the second sub-pixel P2, and the first protection electrode 33 is configured to be connected with a first power supply line formed later. The second protection electrode 34 and the third protection electrode 35 may be disposed between the third sub-pixels P3 of two adjacent pixel units, and the second protection electrode 34 and the third protection electrode 35 are sequentially disposed along the first direction D1, the second protection electrode 34 is configured to be connected with a compensation line formed later, and the third protection electrode 35 is configured to be connected with a second power supply line formed later.

In an exemplary embodiment, the second gate electrode 36 is strip-shaped extending along the first direction D1, and can be arranged in each sub-pixel, and there is an overlapping region between the orthogonal projection of the second gate electrode 36 on the substrate and the second active layer 22, and there is an overlapping region between the orthogonal projection of the second gate electrode 36 on the substrate and the first capacitor electrode 24.

In an exemplary embodiment, after the second conductive layer pattern is formed, the semiconductor layer can be subjected to a conductive treatment by using the second conductive layer as a shield, and A region of the semiconductor layer, which is covered by the second conductive layer, forms channel areas of the first transistor T1, the second transistor T2 and the third transistor T3, and a region of the semiconductor layer, which is not covered by the second conductive layer, is made to be conductive, that is, the first capacitor plate 24 and first and second regions of the three active layers are made to be conductive.

As shown in FIG. 8*b*, after this process, the display substrate includes a first conductive layer disposed on the substrate 10, a first insulating layer 91 covering the first conductive layer, a semiconductor layer disposed on the first insulating layer 91, a second insulating layer 92 and a second conductive layer disposed on the second insulating layer 92. The first conductive layer at least includes the shielding layer 11, the semiconductor layer at least includes the second active layer 22, the third active layer 23 and the first capacitor plate 24, and the second conductive layer at least includes the second gate electrode 36. In an exemplary embodiment, the patterns of the second insulating layer and the second conductive layer may be substantially the same, and the orthographic projection of the second conductive layer on the substrate is within the range of the orthographic projection of the second insulating layer on the substrate.

(5) A third insulating layer pattern is formed. In an exemplary embodiment, forming the third insulating layer pattern may include depositing a third insulating film on the substrate on which the aforementioned patterns are formed, patterning the third insulating film by a patterning process to form a third insulating layer covering the first conductive layer, a plurality of vias are disposed on the third insulating layer, and the plurality of vias at least include: the first to the fourteenth vias V1 to V14, as shown in FIG. 9*a* and FIG. 9*b*, and FIG. 9*b* is a sectional view taken along a direction A-A in FIG. 9*a*.

Figure 9A:
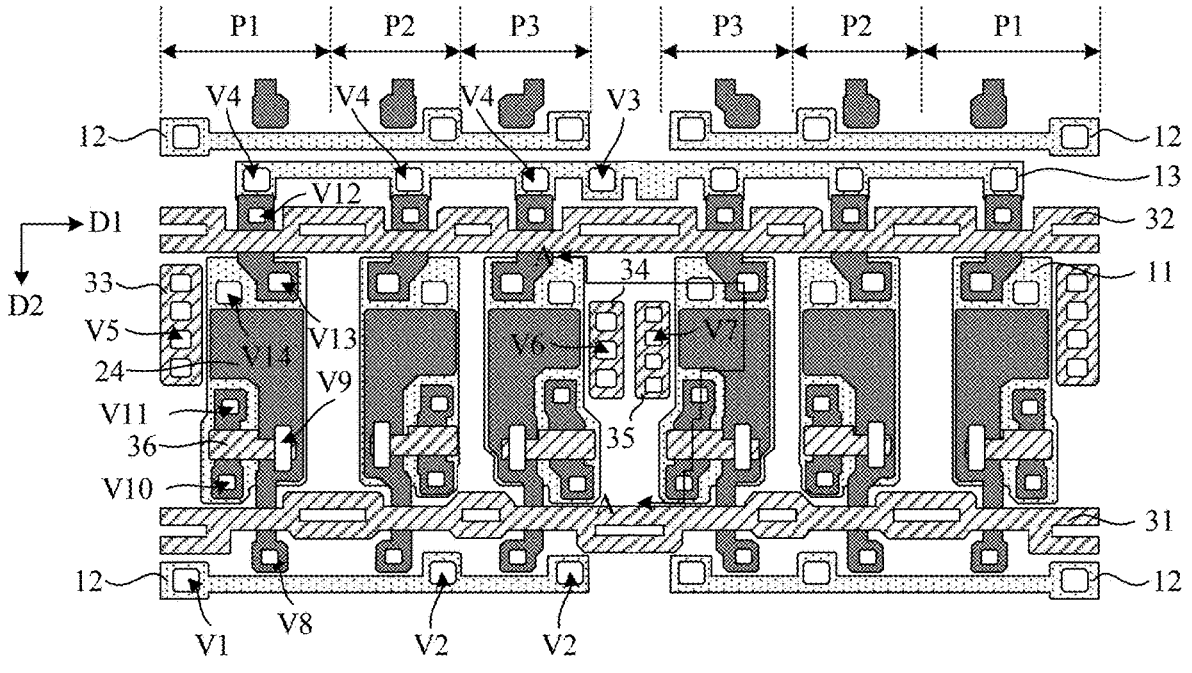
FIG. 9a is a schematic diagram obtained after a third insulating layer pattern is formed according to an embodiment of the present disclosure.
Figure 9B:
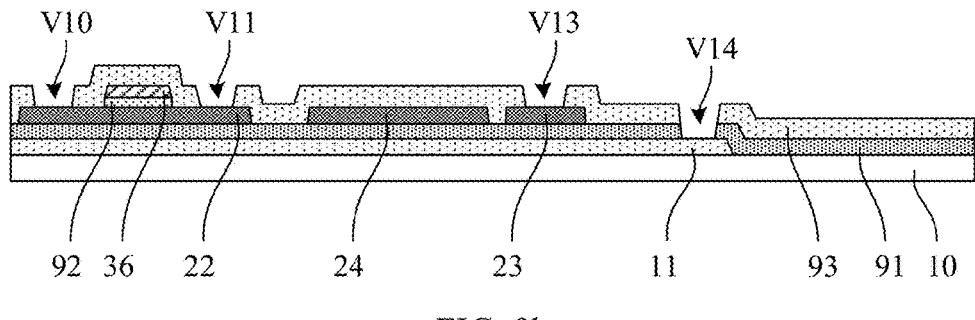

As shown in FIG. 9*a*, in an exemplary embodiment, a first via V1 is disposed on a power supply connection line 12 of the first sub-pixel P1, and second vias V2 are respectively arranged on the power supply connection lines 12 of the second sub-pixel P2 and the third sub-pixel P3, and the third insulating layer and the first insulating layer in the first via V1 and the second via V2 are etched away, exposing the surface of the power supply connection line 12. The first via V1 is configured to connect the first power supply line formed subsequently to the power supply connection line 12 through the via, and the second via V2 is configured to connect the first electrode of the second transistor T2 formed subsequently to the power supply connection line 12 through the via.

In an exemplary embodiment, a third via V3 is disposed on the compensation connection line 13 between adjacent third sub-pixels P3, and the fourth via V4 is disposed on the compensation connection line 13 of each sub-pixel, the third insulating layer and the first insulating layer in the third via V3 and the fourth via V4 are etched away, exposing the surface of the compensation connection line 13. The third via V3 is configured to connect the compensation line formed subsequently to the compensation connection line 13 through that via, and the fourth via V4 is configured to connect the first electrode of the third transistor T3 formed subsequently to the compensation connection line 1 through that via.

In an exemplary embodiment, a plurality of fifth vias V5 are disposed in an area where the first protection electrode 33 is located, and the third insulating layer in the fifth vias V5 is etched away, exposing the surface of the first protection electrode 33. The fifth via V5 is configured to connect the first power supply line formed subsequently to the first protection electrode 33 through that via, and providing a plurality of fifth vias V5 can improve the connection reliability.

In an exemplary embodiment, a plurality of sixth vias V6 are disposed in an area where the second protection electrode 34 is located, and the third insulating layer in the sixth vias V6 is etched away, exposing the surface of the second protection electrode 34. The sixth via V6 is configured to connect the compensation line formed subsequently to the second protection electrode 34 through that via, and providing a plurality of sixth vias V6 can improve the connection reliability.

In an exemplary embodiment, a plurality of seventh vias V7 are disposed in an area where the third protection electrode 35 is located, and the third insulating layer in the seventh vias V7 is etched away, exposing the surface of the third protection electrode 35. The seventh via V7 is configured to connect the second power supply line formed subsequently to the third protection electrode 35 through the via, and providing a plurality of seventh vias V7 can improve the connection reliability.

In an exemplary embodiment, an eighth via V8 is disposed in an area where a first region of the first active layer of each sub-pixel is located, and the third insulating layer in the eighth via V8 is etched away, exposing the surface of the first region of the first active layer. The eighth via V8 is configured to connect the data line formed subsequently to the first region of the first active layer through the via.

In an exemplary embodiment, a ninth via V9 is disposed in an area where the first capacitor plate 24 and the second gate electrode 36 of each sub-pixel are located, the third insulating layer in the ninth via V9 is etched away, and the ninth via V9 exposes surfaces of the first capacitor plate 24 and the second gate electrode 36 simultaneously. The ninth via V9 is configured such that the second electrode of the first transistor T1 (the gate electrode of the second transistor T2) formed subsequently is connected to the first capacitor plate 24 and the second gate electrode 36 simultaneously through the via.

In an exemplary embodiment, a tenth via V10 is disposed in an area where a first region of the second active layer of each sub-pixel is located, and the third insulating layer in the tenth via V10 is etched away, exposing the surface of the first region of the second active layer. The tenth via V10 of the first sub-pixel P1 is configured to connect the first power supply line formed subsequently to the first region of the second active layer through the via, and the tenth vias V10 of the second sub-pixel P2 and the third sub-pixel P3 are configured to connect the first electrode of the second transistor T2 formed subsequently to the first region of the second active layer through the via.

In an exemplary embodiment, an eleventh via V11 is disposed in an area where a second region of the second active layer of each sub-pixel is located, and the third insulating layer in the eleventh via V11 is etched away, exposing the surface of the second region of the second active layer. The eleventh via V11 is configured to connect a second capacitor plate (the second electrode of the second transistor T2 and the second electrode of the third transistor T3) formed subsequently to the second region of the second active layer through the via.

In an exemplary embodiment, a twelfth via V12 is disposed in an area where a first region of the third active layer of each sub-pixel is located, and the third insulating layer in the twelfth via V12 is etched away, exposing the surface of the first region of the third active layer. The twelfth via V12 is configured to connect the first electrode of the third transistor T3 formed subsequently to the first region of the third active layer through the via.

In an exemplary embodiment, a thirteenth via V13 is disposed in an area where a second region of the third active layer of each sub-pixel is located, and the third insulating layer in the thirteenth via V13 is etched away, exposing the surface of the second region of the third active layer. The thirteenth via V13 is configured to connect a second capacitor plate (the second electrode of the second transistor T2 and the second electrode of the third transistor T3) formed subsequently to the second region of the third active layer through the via.

In an exemplary embodiment, a fourteenth via V14 is disposed in an area where a shielding layer 11 of each sub-pixel is located, and the third insulating layer and the first insulating layer in the fourteenth via V14 are etched away, exposing the surface of the shielding layer 11. The fourteenth via V14 is configured to connect a second capacitor plate (the second electrode of the second transistor T2 and the second electrode of the third transistor T3) formed subsequently to the shielding layer 11 through the via.

As shown in FIG. 9*b*, after this process, the display substrate includes the first conductive layer disposed on the substrate 10, the first insulating layer 91 covering the first conductive layer, the semiconductor layer disposed on the first insulating layer 91, the second insulating layer 92, the second conductive layer disposed on the second insulating layer 92, and the third insulating layer 93 covering the second conductive layer. The first conductive layer at least includes the shielding layer 11, the semiconductor layer at least includes the second active layer 22, the third active layer 23 and the first capacitor plate 24, the second conductive layer at least includes the second gate electrode 36, and the third insulating layer 93 is provided with a plurality of vias including at least the tenth via V10, the eleventh via V11, the thirteenth via V13 and the fourteenth via V14.

Figure 10A:
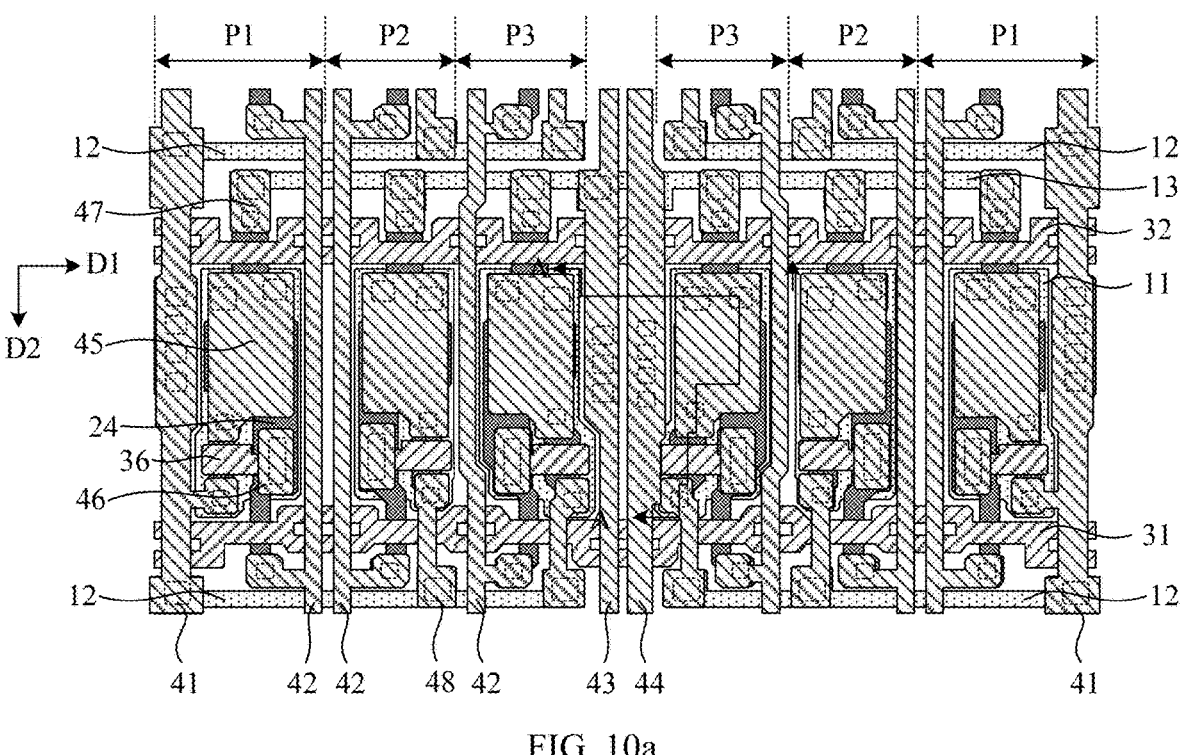
FIG. 10a is a schematic diagram obtained after a third conductive layer pattern is formed according to an embodiment of the present disclosure.
Figure 10B:
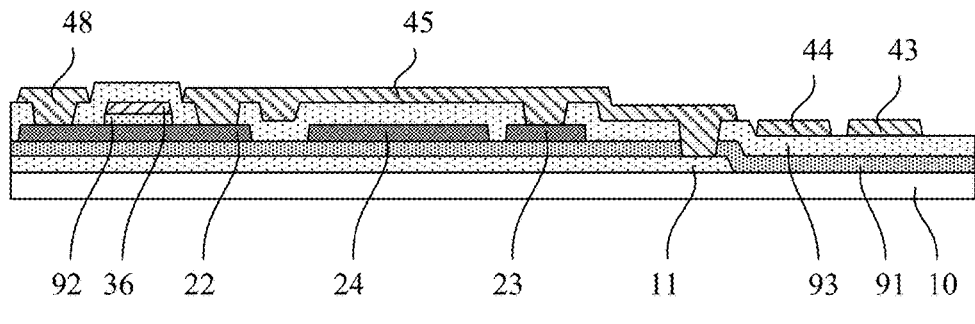

(6) A third conductive layer pattern is formed. In an exemplary embodiment, forming the third conductive layer pattern may include: depositing a third metal film on the substrate on which the aforementioned patterns are formed, patterning the third metal film by a patterning process, and forming a third conductive layer arranged on the third insulating layer, the third conductive layer at least includes: a first power supply line 41, a data line 42, a compensation line 43, a second power supply line 44, a second capacitor plate 45, a first connecting electrode 46, a second connecting electrode 47 and a third connecting electrode 48, as shown in FIG. 10*a* and FIG. 10*b*, and FIG. 10*b* is a sectional view taken along a direction A-A in FIG. 10*a*. In an exemplary embodiment, the third conductive layer may be referred to as a source drain metal (SD) layer.

As shown in FIG. 10*a*, in an exemplary embodiment, the first power supply line 41 is disposed in each pixel unit at a side of the first sub-pixel P1 away from the second sub-pixel P2, the first power supply line 41 extends along the second direction D2, on the one hand, the first power supply line 41 is connected to the power supply connection line 12 through the first via V1, on the other hand, the first power supply line 41 is connected to the first protection electrode 33 through a plurality of fifth vias V5, and on the other hand, the first power supply line 41 is connected to the first region of the second active layer of the first sub-pixel P1 through the tenth via V10, so that the high-level signal transmitted by the first power supply line 41 is written into the first electrode of the second transistor T2.

In an exemplary embodiment, a data line 42 is disposed in each sub-pixel, the data line 42 extends along the second direction D2 and is connected to the first region of the first active layer through the eighth via V8, so that the data signal transmitted by the data line 42 is written into the first transistor T1 of each sub-pixel. In an exemplary embodiment, a data line 42 in the second sub-pixel P2 is disposed close to a data line 42 in the third sub-pixel P3.

In an exemplary embodiment, a compensation line 43 is disposed between the third sub-pixels P3 of two adjacent pixel units, the compensation line 43 extends along the second direction D2, on the one hand, the compensation line 43 is connected to the second protection electrode 34 through a plurality of sixth vias V6, and on the other hand, the compensation line 43 is connected to the compensation connection line 13 through the third via V3, so that the compensation signal transmitted by the compensation line

43 is written into the third transistor T3 of each sub-pixel through the compensation connection line 13.

In an exemplary embodiment, a second power supply line 44 is disposed between the third sub-pixels P3 of two adjacent pixel units, and the second power supply line 44 extends along the second direction D2, and is connected to the third protection electrode 35 through a plurality of seventh vias V7.

In an exemplary embodiment, a second capacitor plate 45 is disposed in each sub-pixel, on the one hand, the second capacitor plate 45 is connected to the second region of the second active layer through the eleventh via V11, on the other hand, the second capacitor plate 45 is connected to the second region of the third active layer through the thirteenth via V13, and on the other hand, the second capacitor plate 45 is connected to the shielding layer 11 through the fourteenth via V14. In an exemplary embodiment, there is an overlapping area between the orthographic projection of the second capacitor plate 45 on the substrate and the orthographic projection of the first capacitor plate 24 on the substrate, and the second capacitor plate 45 and the first capacitor plate 24 form a first storage capacitor. Since the second capacitor plate 45 is connected to the shielding layer 11 and they both have the same potential, the shielding layer 11 and the first capacitor plate 24 form a second storage capacitor, and a first storage capacitor and the second storage capacitor connected in parallel are formed in each sub-pixel, effectively increasing the capacity of storage capacitor in each sub-pixel. In an exemplary embodiment, the second capacitor plate 45 can serve as the second electrode of the second transistor T2 and the second electrode of the third transistor T3 simultaneously, so that the second capacitor plate 45, the second electrode of the second transistor T2 and the second electrode of the third transistor T3 have the same potential.

In an exemplary embodiment, a first connection electrode 46 is disposed in each sub-pixel, and the first connection electrode 46 is connected to the first capacitor plate 24 and the second gate electrode 36 through the ninth via V9 simultaneously. In an exemplary embodiment, the first connection electrode 46 can serve as the second electrode of the first transistor T1, so that the gate electrode of the second transistor T2, the second electrode of the first transistor T1 and the first capacitor plate 24 have the same potential.

In an exemplary embodiment, a second connection electrode 47 is disposed in each sub-pixel, on the one hand, the second connection electrode 47 is connected to the compensation connection line 13 through the fourth via V4, and on the other hand, the second connection electrode 47 is connected to the first region of the third active layer through the twelfth via V12. In an exemplary embodiment, the second connection electrode 47 can serve as the first electrode of the third transistor T3, so that the compensation signal transmitted by the compensation line 43 is written into the third transistor T3 of each sub-pixel through the compensation connection line 13.

In an exemplary embodiment, a third connection electrode 48 is disposed in the second sub-pixel P2 and the third sub-pixel P3 of each pixel unit, on the one hand, the third connection electrode 48 is connected to the power supply connection line 12 through the second via V2, and on the other hand, the third connection electrode 48 is connected to the first region of the second active layer through the tenth via V10. In an exemplary embodiment, the third connection electrode 48 can serve as the first electrode of the second transistor T2, so that the high-level signal transmitted by the first power supply line 41 is written into the first electrode of the second transistor T2 through the power supply connection line 12.

As shown in FIG. 10b, after this process, the display substrate includes the first conductive layer disposed on the substrate 10, the first insulating layer 91 covering the first conductive layer, the semiconductor layer disposed on the first insulating layer 91, the second insulating layer 92, the second conductive layer disposed on the second insulating layer 92, the third insulating layer 93 covering the second conductive layer and the third conductive layer disposed on the third insulating layer 93. The first conductive layer at least includes the shielding layer 11, the semiconductor layer at least includes the second active layer 22, the third active layer 23 and the first capacitor plate 24, the second conductive layer at least includes the second gate electrode 36, and the third insulating layer 93 is provided with a plurality of vias including at least the tenth via V10, the eleventh via V11, the thirteenth via V13 and the fourteenth via V14, the third conductive layer at least includes a compensation line 43, a second power supply line 44, a second capacitor plate 45 and a third connection electrode 48, the third connection electrode 48 is connected to the second active layer 22 through the tenth via V10, and the second capacitor plate 45 is respectively connected to the second active layer 22, the third active layer 23 and the shielding layer 11 through the eleventh via V11, the thirteenth via V13 and the fourteenth via V14.

(6) A fourth insulating layer and first flat layer pattern is formed. In an exemplary embodiment, forming the fourth insulating layer and first flat layer pattern may include: first depositing the fourth insulating film on the substrate on which the aforementioned patterns are formed, then coating the flat film, and patterning the flat film and the fourth insulating film through a patterning process to form the fourth insulating layer covering the third conductive layer and the flat layer disposed on the fourth insulating layer, the fourth insulating layer and the flat layer are provided with patterns of an anode via K1 and an electrode via K2, as shown in FIGS. 11a and 11b, and FIG. 11b is a sectional view taken along a direction A-A in FIG. 11a.

Figure 11A:
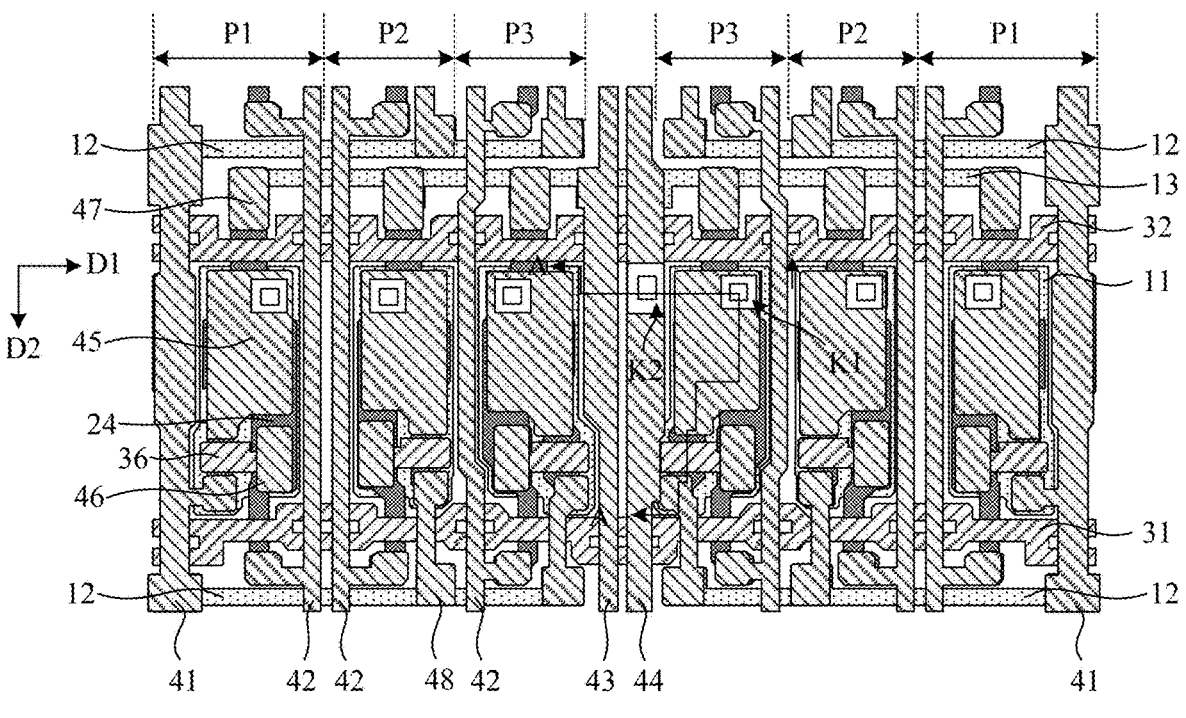
FIG. 11a is a schematic diagram obtained after a first flat layer pattern is formed according to an embodiment of the present disclosure.

As shown in FIG. 11a, in an exemplary embodiment, an anode via K1 is disposed in each sub-pixel, and the flat layer and the fourth insulating layer in the anode via K1 are removed, exposing the surface of the second capacitor plate 45. The electrode via K2 is arranged between the third sub-pixels P3 of two adjacent pixel units, and the flat layer and the fourth insulating layer in the electrode via K2 are removed, exposing the surface of the second power supply line 44.

In an exemplary embodiment, both the anode via K1 and the electrode via K2 may include a large hole disposed on the flat layer 95 and a small hole disposed on the fourth insulating layer 94, and the small hole is disposed in the large hole.

Figure 11B:
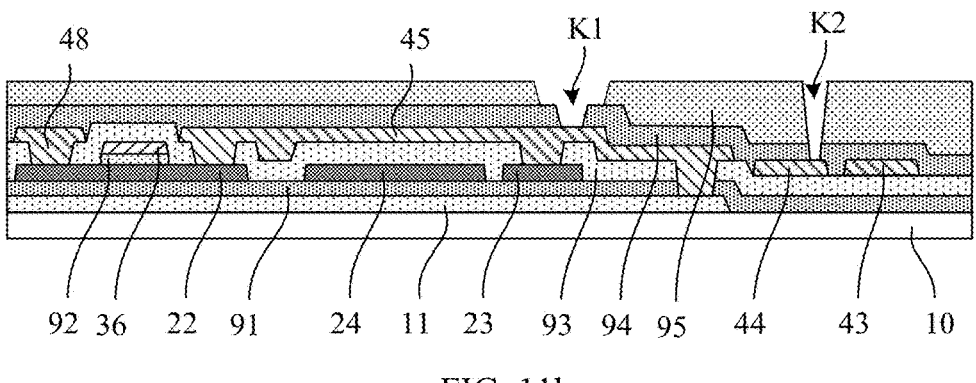

As shown in FIG. 11b, after this process, the display substrate includes a first conductive layer disposed on the substrate 10, a first insulating layer 91 covering the first conductive layer, a semiconductor layer disposed on the first insulating layer 91, a second insulating layer 92, a second conductive layer disposed on the second insulating layer 92, a third insulating layer 93 covering the second conductive layer, a third conductive layer disposed on the third insulating layer 93, a fourth insulating layer 94 covering the third insulating layer 93, and a flat layer 95 covering the fourth insulating layer 94. The fourth insulating layer 94 and the flat layer 95 are provided with an anode via K1 and an electrode via K2, the anode via K1 exposes a second capacitor plate 45 and the electrode via K2 exposes a second power supply line 44.

So far, the drive circuit layer pattern is prepared on the substrate. In an exemplary embodiment, the drive circuit layer of each sub-pixel at least includes a first transistor T1, a second transistor T2, a third transistor T3 and a storage capacitor.

In an exemplary embodiment, the first insulating layer, the second insulating layer, the third insulating layer and the fourth insulating layer may be made of any one or more of silicon oxide (SiOx), silicon nitride (SiNx) and silicon nitride (SiON), and may be a single layer, multiple layers or a composite layer. The first insulating layer is referred to as a buffer layer, the second insulating layer is referred to as a gate insulating (GI) layer, the third insulating layer is referred to as an interlayer dielectric (ILD) layer, and the fourth insulating layer is referred to as a passivation (PVX) layer. The planarization thin film may be made of an organic material such as resin. The first metal thin film, the second metal thin film and the third metal thin film may adopt metals such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb) and the films can be of single-layered structure or multi-layered composite structure, for example Ti/Al/Ti etc. The semiconductor film may be made of an amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene and other materials, that is, the present disclosure is applicable to transistors manufactured based on oxide technology, silicon technology and organic matter technology.

Figures 12A, 12B:
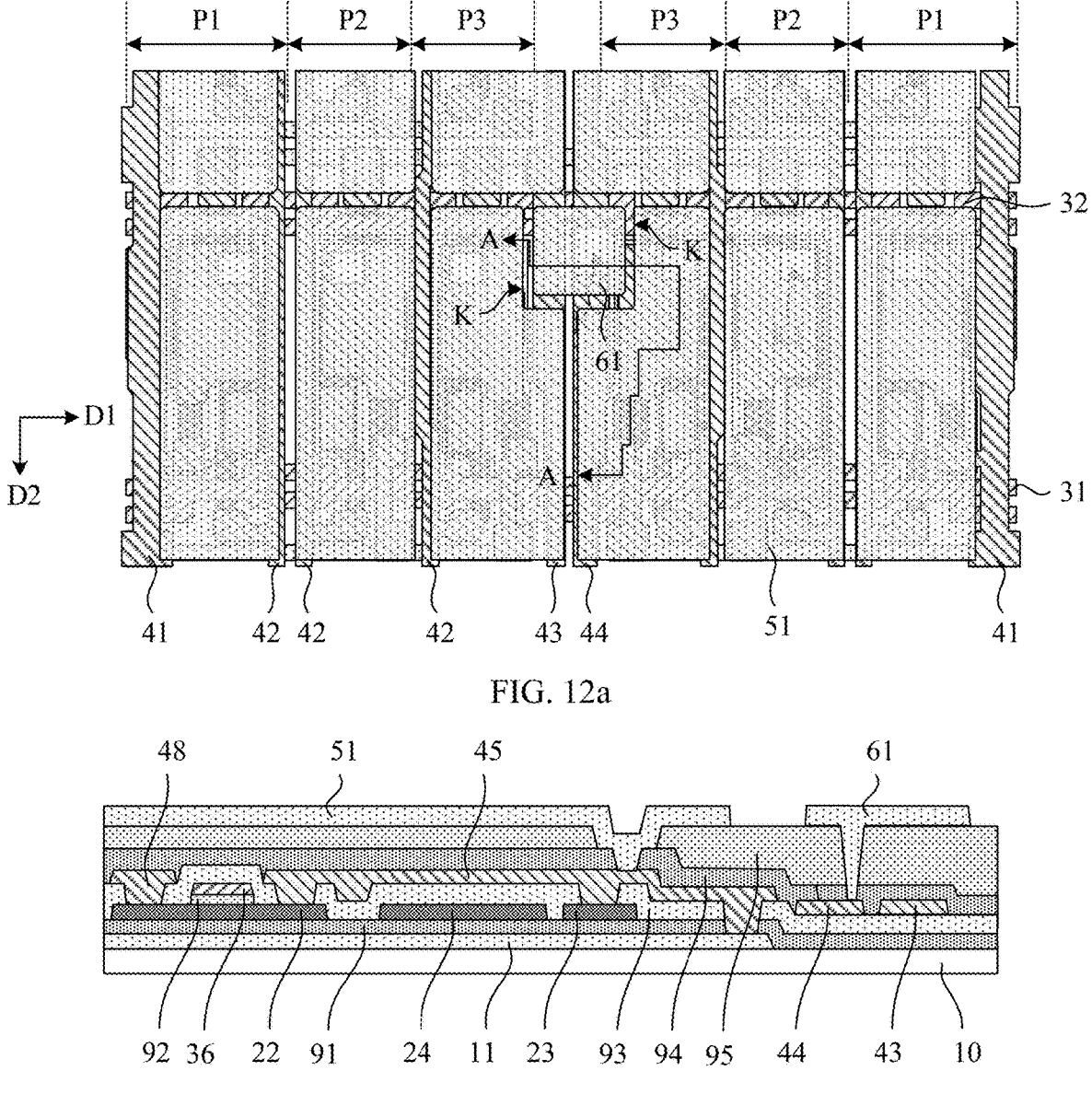

(7) A first transparent conductive layer pattern is formed. In an exemplary embodiment, forming the first transparent conductive layer pattern may include: depositing a first transparent conductive film on the substrate where the aforementioned patterns are formed, patterning the first transparent conductive film through a patterning process to form the first transparent conductive layer pattern, and the first transparent conductive layer pattern includes at least the first anode 51 and the first auxiliary electrode 61, as shown in FIGS. 12a and 12b, and FIG. 12b is a sectional view taken along a direction A-A in FIG. 12a.

In an exemplary embodiment, the first anode 51 is disposed on the flat layer and connected to the second capacitor plate through the anode via K1. The first auxiliary electrode 61 is disposed on the flat layer and connected to the second power supply line 44 through the electrode via K2.

In an exemplary embodiment, the first transparent conductive film may use indium tin oxide (ITO), indium zinc oxide (IZO), or the like.

In an exemplary embodiment, on a plane parallel to the display substrate, the shape of the first auxiliary electrode can be any one or more of the following: triangle, rectangle, trapezoid, polygon, circle and ellipse, edges of the triangle, rectangle, trapezoid and polygon can be straight lines or curves, and corners of the first auxiliary electrode can be set as arc chamfers, which is not limited in this disclosure.

In an exemplary embodiment, on a plane parallel to the display substrate, the display substrate may include a plurality of pixel units, the plurality of pixel units are sequentially arranged along the first direction D1 and the second direction D2, respectively, and the first auxiliary electrode 61 may be arranged between two adjacent pixel units in the first direction D1, so that a plurality of sub-pixels in the two pixel units share one auxiliary electrode.

In an exemplary embodiment, among two adjacent pixel units, the first pixel unit may include a first sub-pixel P1, a second sub-pixel P2 and a third sub-pixel P3 sequentially arranged along the first direction D1, and the second pixel unit may include the first sub-pixel P1, the second sub-pixel P2 and the third sub-pixel P3 sequentially arranged along the opposite direction of the first direction D1, that is, in the first direction D1, the third sub-pixels P3 of the two pixel units are adjacent. In an exemplary embodiment, the first auxiliary electrode 61 may be disposed between two adjacent third sub-pixels P3.

In an exemplary embodiment, a shape of a first anode in the first sub-pixel P1 and the second sub-pixel P2 of two pixel units may be rectangular, which is similar to a shape of the sub-pixel where it is located.

In an exemplary embodiment, in the second direction D2, the first anode of the third sub-pixel P3 in the first pixel unit (left side) has a first end and a second end, and the size of the first end in the first direction D1 is smaller than that of the second end in the first direction D1. In the first direction D1, the distance between the second end and the second pixel unit is smaller than the distance between the first end and the second pixel unit.

In an exemplary embodiment, in the second direction D2, the first anode of the third sub-pixel P3 in the second pixel unit (right side) has a third end and a fourth end, and the size of the third end in the first direction D1 is smaller than that of the fourth end in the first direction D1. In the first direction D1, the distance between the fourth end and the first pixel unit is smaller than the distance between the third end and the first pixel unit.

In an exemplary embodiment, the first auxiliary electrode 61 is disposed between the first end and the third end.

A shape of a first anode in a third sub-pixel P3 of two pixel units can be a rectangle with a groove K, the rectangle is similar to the shape of the third sub-pixel P3, and the groove K is arranged on the side of the first anode 51 close to the first auxiliary electrode 61.

In an exemplary embodiment, the third sub-pixel P3 of the first pixel unit (left side) includes a first anode with a first groove, and the third sub-pixel P3 of the second pixel unit (right side) includes a first anode with a second groove, and the first auxiliary electrode is disposed between the first anode with the first groove and the first anode with the second groove.

In an exemplary embodiment, in the third sub-pixel P3 of the first pixel unit (left side), the first groove is arranged on a side of the first anode close to the second pixel unit, and in the third sub-pixel P3 of the second pixel unit (right side), the second groove is arranged on a side of the first anode close to the first pixel unit, so that an accommodation area is formed between the adjacent third sub-pixels P3 of two pixel units, and the first auxiliary electrode 61 is arranged in the accommodation area.

As shown in FIG. 12*b*, after this process, the display substrate includes a first conductive layer disposed on the substrate 10, a first insulating layer 91 covering the first conductive layer, a semiconductor layer disposed on the first insulating layer 91, a second insulating layer 92, a second conductive layer disposed on the second insulating layer 92, a third insulating layer 93 covering the second conductive layer, a third conductive layer disposed on the third insulating layer 93, a fourth insulating layer 94 covering the third insulating layer 93, a flat layer 95 covering the fourth insulating layer 94, and a first transparent conductive layer arranged on the flat layer 95, the first transparent conductive layer at least includes a first anode 51 and a first auxiliary electrode 61, the first anode 51 is connected to the second capacitor plate 45 through the anode via K1, and the first auxiliary electrode 61 is connected to the second power supply line 44 through the electrode via K2.

(8) An anode and auxiliary electrode pattern is formed. In an exemplary embodiment, forming the anode and auxiliary electrode pattern may include: sequentially depositing a fourth metal film and a second transparent conductive film on the substrate on which the foregoing patterns are formed, and patterning the fourth metal film and the second transparent conductive film by the patterning process, and forming patterns of the second anode 52, the third anode 53, the second auxiliary electrode 62 and the third auxiliary electrode 63. The second anode 52 is arranged on a side of the first anode 51 away from the substrate and is connected to the first anode 51, the third anode 53 is arranged on a side of the second anode 52 away from the substrate and is connected to the second anode 52, the second auxiliary electrode 62 is arranged on a side of the first auxiliary electrode 61 away from the substrate and is connected to the first auxiliary electrode 61, and the third auxiliary electrode 63 is arranged on a side of the second auxiliary electrode 62 away from the substrate and is connected to the second auxiliary electrode 62. The stacked first anode 51, the second anode 52 and the third anode 53 form the anode 50, and the stacked first auxiliary electrode 61, the second auxiliary electrode 62 and the third auxiliary electrode 63 form the auxiliary electrode 60, as shown in FIG. 13.

In an exemplary embodiment, in a plane parallel to the display substrate, the shapes of the second anode 52 and the third anode 53 are similar to the shape of the first anode 51, the orthographic projection of the second anode 52 on the substrate may be within the range of the orthographic projection of the first anode 51 on the substrate, and the orthographic projection of the second anode 52 on the substrate may be within the range of the orthographic projection of the third anode 53 on the substrate. In a plane parallel to the display substrate, the shapes of the second auxiliary electrode 62 and the third auxiliary electrode 63 are similar to the shape of the first auxiliary electrode 61, the orthographic projection of the second auxiliary electrode 62 on the substrate can be within the range of the orthographic projection of the first auxiliary electrode 61 on the substrate, and the orthographic projection of the second auxiliary electrode 62 on the substrate can be within the range of the orthographic projection of the third auxiliary electrode 63 on the substrate.

Figures 13, 14:
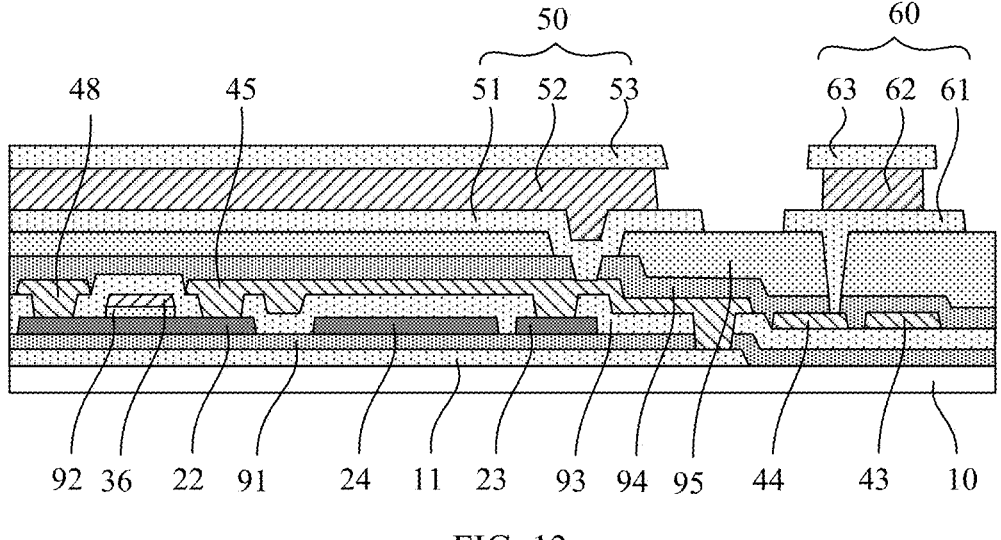
FIG. 13 is a schematic diagram obtained after an anode and auxiliary electrode pattern is formed according to an embodiment of the present disclosure.
FIG. 14 is a sectional schematic diagram of an auxiliary electrode according to an embodiment of the present disclosure.

FIG. 14 is a sectional schematic diagram of an auxiliary electrode according to an exemplary embodiment of the present disclosure, and is an enlarged view of the auxiliary electrode in FIG. 13. As shown in FIG. 14, in a plane perpendicular to the display substrate, the first auxiliary electrode 61 located on a side (lower side) of the second auxiliary electrode 62 close to the substrate has an edge protruding from the contour of the second auxiliary electrode 62, forming a "roof seat" structure, the third auxiliary electrode 63 located on a side (upper side) of the second auxiliary electrode 62 away from the substrate has an edge protruding from the contour of the second auxiliary electrode 62, the first auxiliary electrode 61 and the third auxiliary electrode 63 form an "eave" structure, so that the stacked first auxiliary electrode 61, the second auxiliary electrode 62 and the third auxiliary electrode 63 form a structure with a shape like a Chinese character "工".

In an exemplary embodiment, the first anode 51 located on a side (lower side) of the second anode 52 close to the substrate has an edge protruding from the contour of the second anode 52, forming a "roof seat" structure, the third anode 53 located on a side (upper side) of the second anode 52 away from the substrate has an edge protruding from the contour of the second anode 52, forming an "eave" structure, so that the stacked first anode 51, second anode 52 and third anode 53 form a structure with a shape like a Chinese character "工 ".

In an exemplary embodiment, in a process of patterning the fourth metal film and the second transparent conducting film, a first etchant and a second etchant can be used for etching respectively, and a structure, with a shape like a Chinese character "工 ", of the auxiliary electrode and the anode can be formed by drilling. In an exemplary embodiment, the first etchant may be an etchant (ITO etchant) for etching a transparent conducting material, and the second etchant may be an etchant (metal etchant) for etching a metal material. In an exemplary embodiment, after the photoresist pattern is formed by masking, exposing and developing the photoresist, the etching process may include: firstly etching the second transparent conductive film which is not covered by the photoresist by using ITO etchant, so that an area not covered by the photoresist exposes the fourth metal film, to form patterns of the third anode 53 and the third auxiliary electrode 63. Then, the exposed fourth Metal film is etched with Metal etchant to form patterns of the second anode 52 and the second auxiliary electrode 62. Since the rate of etching the fourth metal film by the Metal etchant is higher than the rate of etching the first transparent conductive film and the second transparent conductive film, side surfaces of the second anode 52 and the second auxiliary electrode 62 are etched into pits. The first anode 51 below the second anode 52 and the third anode 53 above the second anode 52 both protrude from the second anode 52 for a certain distance, while the first auxiliary electrode 61 below the second auxiliary electrode 62 and the third auxiliary electrode 63 above the second auxiliary electrode 62 protrude from the second auxiliary electrode 62 for a certain distance, forming a structure with a shape like a Chinese character "工 ".

As shown in FIG. 14, on a plane perpendicular to the display substrate, the formed auxiliary electrode has a plurality of exposed surfaces, which respectively include: the first upper surface 611, i.e., the surface of the part of the first auxiliary electrode 61 protruding from the second auxiliary electrode 62 on the side away from the substrate, the second side surface 621 on the side part of the second auxiliary electrode 62, the third upper surface 631 on the upper side of the third auxiliary electrode 63 (the side away from the substrate), a third side surface 632 on the side part of the third auxiliary electrode 63, and a third lower surface 633 at the lower side of the third auxiliary electrode 63 (the side close to the substrate), the third lower surface 633 refers to the surface of the part of the third auxiliary electrode 63 protruding from the second auxiliary electrode 62 on the side close to the substrate. In an exemplary embodiment, the aforementioned side surfaces refer to multiple circumferential surfaces each having a normal direction which is parallel or nearly parallel to the plane of the substrate. For example, in a plane parallel to the substrate, the second side surface 621 of the rectangular second auxiliary electrode 62 includes four circumferential surfaces.

In an exemplary embodiment, a material of the fourth metal film may include any one or more of silver (Ag), copper (Cu), aluminum (Al), titanium (TI), and molybdenum (Mo), or an alloy material of the above metals, and a second transparent conductive material may be indium tin oxide (ITO) or indium zinc oxide (IZO), etc.

Figure 15A:
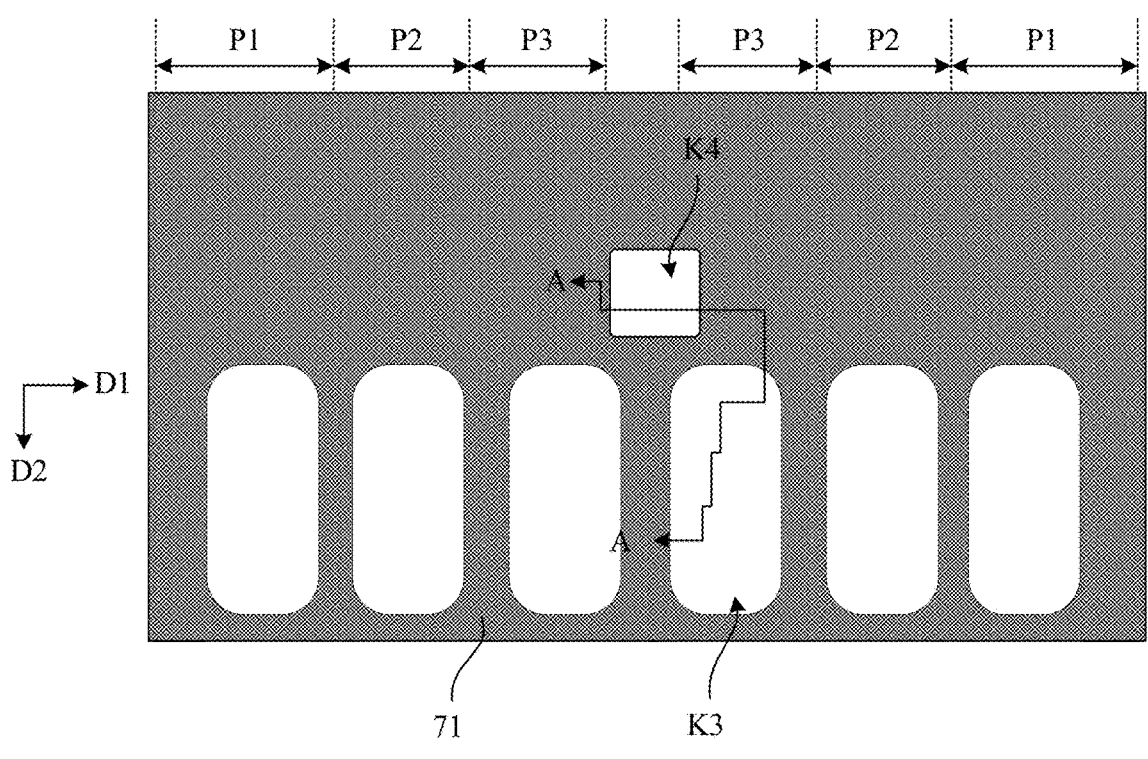
FIGS. 15a and 15b are schematic diagrams obtained after a pixel definition layer pattern is formed according to an embodiment of the present disclosure.
Figure 15B:
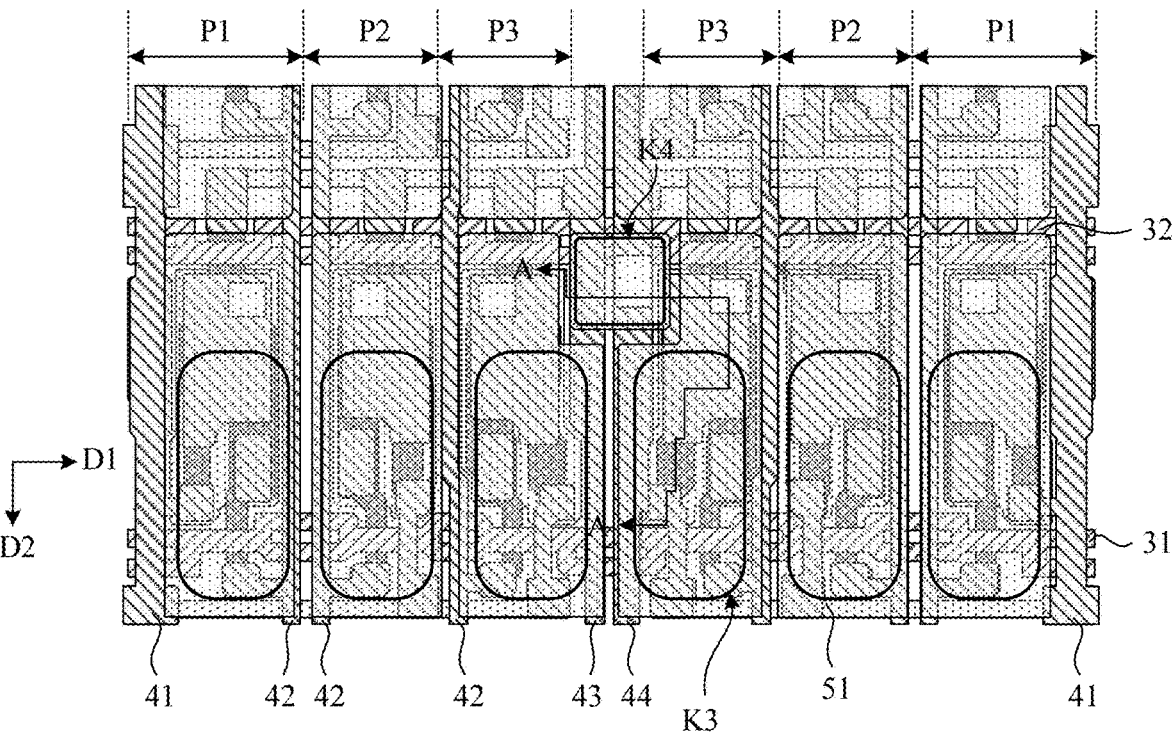
Figure 15C:
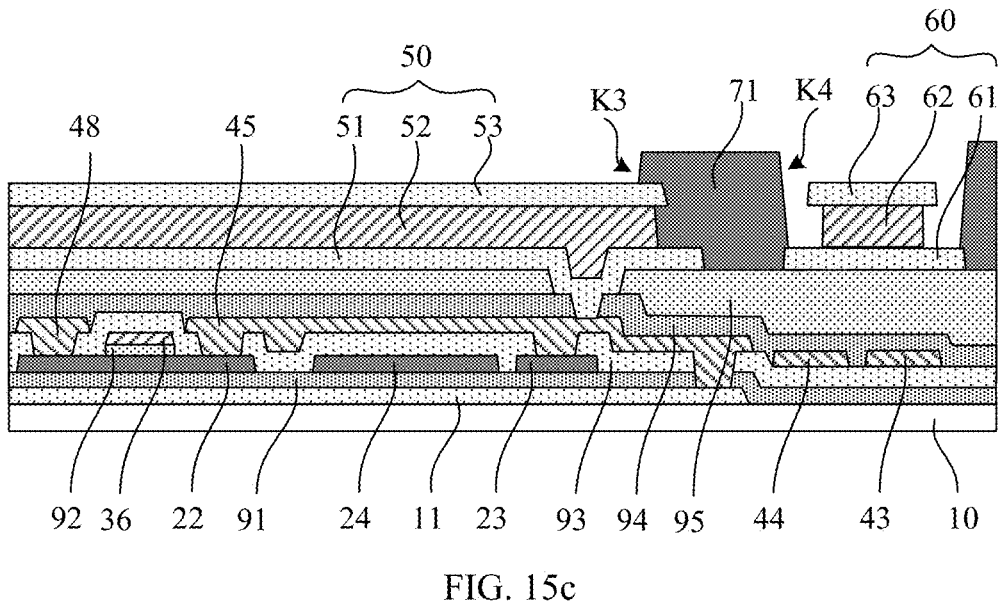
FIG. 15c is a sectional view taken along a direction A-A in FIGS. 15a and 15b.

(9) A pixel definition layer pattern is formed. In an exemplary embodiment, forming the pixel definition layer pattern may include: coating a pixel definition film on the substrate on which the aforementioned patterns are formed, patterning the pixel definition film through a patterning process to form a pixel definition (PDL) layer 71 pattern. The pixel definition layer 71 is provided with a first pixel opening K3 and a second pixel opening K4, the pixel definition layer 71 in the first pixel opening K3 is removed, exposing part of the surface of the third anode 53 in anodes, and the pixel definition layer 71 in the second pixel opening K4 is removed, exposing entire surfaces of the second auxiliary electrode 62 and the third auxiliary electrode 63 in auxiliary electrodes, as shown in FIG. 15a, FIG. 15b and FIG. 15c. FIG. 15a is a schematic diagram of a shape of a pixel opening in a pixel definition layer, FIG. 15b is a schematic diagram of a pixel opening position in a pixel definition layer, the pixel definition layer is set to be transparent, FIG. 15c is a sectional view taken along a direction A-A in FIGS. 15a and 15b.

In an exemplary embodiment, the orthographic projection of the first pixel opening K3 on the substrate is within the range of the orthographic projection of the third anode 53 on the substrate, the orthographic projection of the second pixel opening K4 on the substrate is within the range of the orthographic projection of the first auxiliary electrode 61 on the substrate, and the orthographic projections of the second auxiliary electrode 62 and the third auxiliary electrode 63 on the substrate are within the range of the orthographic projection of the second pixel opening K4 on the substrate. The second pixel opening K4 exposing the entire surfaces of the second auxiliary electrode 62 and the third auxiliary electrode 63 means that the second pixel opening has a second lower opening close to the substrate and a second upper opening away from the substrate, the orthographic projections of the second auxiliary electrode 62 and the third auxiliary electrode 63 on the substrate are within the range of the orthographic projection of the second lower opening on the substrate.

In an exemplary embodiment, the pixel definition layer may be made of polyimide, acrylic, polyethylene terephthalate, or the like. In a plane parallel to the display substrate, the shape of the first pixel opening K3 may be an ellipse, and the shape of the second pixel opening K4 may be a rectangle. In a plane perpendicular to the display substrate, the sectional shapes of the first pixel opening K3 and the second pixel opening K4 may be a rectangle or a trapezoid.

Figure 16:
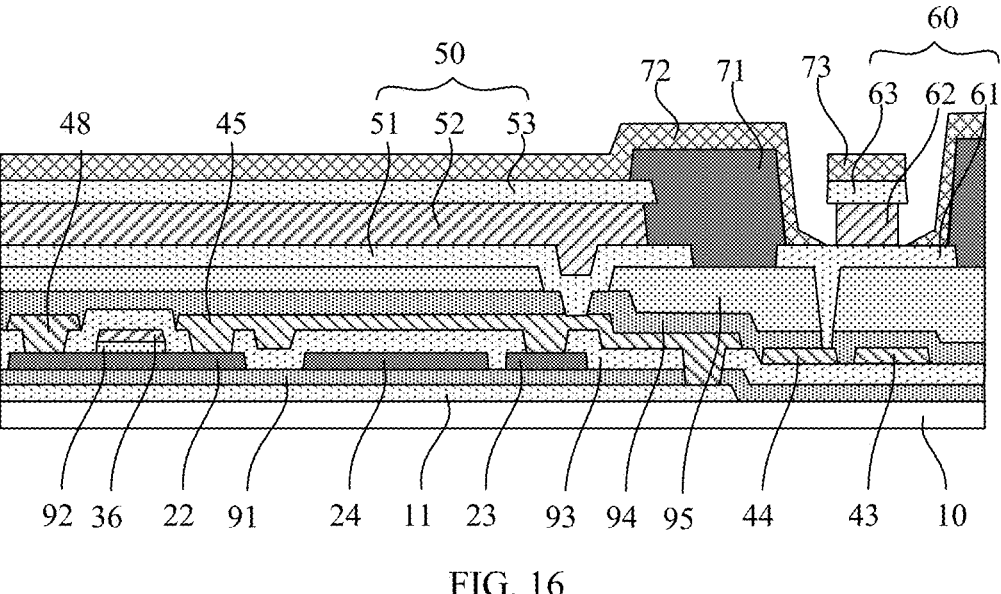
FIG. 16 is a schematic diagram obtained after an organic light emitting layer pattern is formed according to an embodiment of the present disclosure.

(10) An organic light emitting layer pattern is formed. In an exemplary embodiment, forming the organic light emitting layer pattern may include: evaporating an organic light emitting material on the substrate on which the above patterns are formed to form patterns of an organic light emitting layer 72 and an organic light emitting block 73. The organic light emitting layer 72 is disposed in a region outside the third auxiliary electrode 63, the organic light emitting layer 72 is connected to the third anode 53 in anodes 50 through the first pixel opening K3, the organic light emitting block 73 is disposed on a surface of a side of the third auxiliary electrode 63 away from the substrate, and the organic light emitting block 73 is disposed to be isolated from the organic light emitting layer 72, as illustrated in FIG. 16.

In an exemplary embodiment, due to a structure with a shape like a Chinese character "工 " of the auxiliary electrode, the third auxiliary electrode 63 protrudes from the second auxiliary electrode 62 for a certain distance, so the organic light emitting material is broken at a side edge of the third auxiliary electrode 63, the organic light emitting block 73 is formed on the second upper surface 631 of the third auxiliary electrode 63, and the organic light emitting layer 72 is formed in a region outside the third auxiliary electrode 63, thus achieving the mutual isolation between the organic light emitting layer 72 and the organic light emitting block 73. In an exemplary embodiment, an orthographic projection of the organic light emitting block 73 on the substrate may be approximately equal to the orthographic projection of the third auxiliary electrode 63 on the substrate. The organic light emitting layer is separated by the auxiliary electrode of a structure with a shape like a Chinese character " 工 " to form an isolated and separated organic light emitting block, effectively avoiding the interference of the organic light emitting block with emitted light, thereby improving the quality of the emitted light and facilitating the improvement of the display quality.

In an exemplary embodiment, the organic light emitting layer 72 is connected to the third anode 53 through the first pixel opening K3, thus realizing the connection between the organic light emitting layer 72 and the anode 50. One part of the organic light emitting layer 72 located in the second pixel opening K4 region covers the sidewall of the second pixel opening K4, while the other part covers a part of the bottom surface of the second pixel opening K4, and forms a slope on the bottom surface of the second pixel opening K4. In an exemplary embodiment, the organic light emitting layer 72 located on the bottom surface of the second pixel opening K4 is at a certain distance from the second auxiliary electrode 62, and the region between the organic light emitting layer 72 and the second auxiliary electrode 62 exposes the first auxiliary electrode 61.

In an exemplary embodiment, the organic light emitting layer may include an emitting layer (EML) and any one or more of the following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary embodiment, the organic light emitting layer may be formed by evaporation using a Fine Metal Mask (FMM) or an open mask, or by an ink jet process.

In an exemplary embodiment, the organic light emitting layer may be formed through the following preparation method. First, an open mask is used for evaporation to sequentially form a hole injection layer and a hole transport layer, and a common layer of the hole injection layer and the hole transport layer is formed on the display substrate. Then, a fine metal mask is used for evaporation to form an electron block layer and a red light emitting layer in a red sub-pixel, an electron block layer and a green light emitting layer in a green sub-pixel, and an electron block layer and a blue light emitting layer in a blue sub-pixel. The electron block layers and the light emitting layers of adjacent sub-pixels may overlap slightly (for example, an overlap portion accounts for less than 10% of the area of a pattern of the respective light emitting layer), or may be isolated from one another. Then, an open mask is used for evaporation to sequentially form a hole block layer, an electron transport layer, and an electron injection layer, and a common layer of the hole block layer, the electron transport layer, and the electron injection layer is formed on the display substrate.

In an exemplary embodiment, the electron block layer may be used as a micro-cavity regulating layer of a light emitting device. By designing the thickness of the electron block layer, the thickness of the organic light emitting layer between the cathode and the anode can satisfy the design for the length of a micro-cavity. In some exemplary implementation modes, the hole transport layer, hole block layer, or electron transport layer in the organic light emitting layer may be adopted as the micro-cavity adjustment layer of the light emitting device. No limits are made in the present disclosure.

In an exemplary embodiment, the light emitting layer may include a host material and a dopant material doped into the host material. The doping ratio of the dopant material in the light emitting layer is 1% to 20%. Within the doping ratio range, on the one hand, the host material in the light emitting layer can effectively transfer the exciton energy to the dopant material in the light emitting layer to excite the light emitting layer to emit light; on the other hand, the host material in the light emitting layer "dilutes" the dopant material in the light emitting layer, which effectively improves the fluorescence quenching caused by the collision between molecules and energy of the dopant material in the light emitting layer, and the luminous efficiency and device life are improved. In an exemplary embodiment, the doping ratio refers to the ratio of the mass of the dopant material to the mass of the light emitting layer, that is, the mass percentage. In an exemplary embodiment, the host material and the dopant material are co-evaporated through a multi-source evaporation process, so that the host material and the dopant material are uniformly dispersed in the light emitting layer. A doping ratio may be adjusted by controlling an evaporation rate of the dopant material or by controlling an evaporation rate ratio of the host material to the dopant material during an evaporation process. In an exemplary embodiment, the thickness of the light emitting layer may be about 10 nm to 50 nm.

In an exemplary embodiment, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, or may be made of a p-type dopant of an electron absorption system and a dopant of a hole transport material. In an exemplary embodiment, a thickness of the hole injection layer may be about 5 nm to 20 nm.

In an exemplary embodiment, the hole transport layer may be made of a material with high hole mobility, such as an aromatic amine compound, and its substituent group may be carbazole, methylfluorene, spirofluorene, dibenzothiophene or furan. In an exemplary embodiment, the thickness of the hole transport layer may be about 40 nm to 150 nm.

In an exemplary embodiment, the hole blocking layer and the electron transporting layer may use aromatic heterocyclic compounds, such as imidazole derivatives like benzimidazole derivatives, imidazopyridine derivatives, and benzimidazophenanthridine derivatives; oxazine derivatives like pyrimidine derivatives and triazine derivatives; compounds having a nitrogen-containing six-membered ring structure (also including compounds having a phosphine oxide-based substituent on the heterocyclic ring) such as quinoline derivatives, isoquinoline derivatives, phenanthroline derivatives, etc. In an exemplary embodiment, a thickness of the hole blocking layer may be about 5 nm to 15 nm, and a thickness of the electron transporting layer may be about 20 nm to 50 nm.

In an exemplary embodiment, the electron injection layer may use alkali metals or metals such as lithium fluoride (LiF), ytterbium (Yb), magnesium (Mg) or Calcium (ca), or compounds of these alkali metals or metals. In an exemplary embodiment, a thickness of the electron injection layer may be about 0.5 nm to 2 nm.

(11) A cathode pattern is formed. In an exemplary embodiment, forming the cathode pattern may include: evaporating a cathode material on the substrate on which the above patterns are formed to form the pattern of the cathode 80. The cathode 80 is connected to the organic light emitting layer 72, and a large-area contact connection with the auxiliary electrode 60 is achieved by wrapping the organic light emitting block 73 and the auxiliary electrode 60, as shown in FIG. 17.

In an exemplary embodiment, the cathode 80 may be an integral structure. In a region outside the auxiliary electrode 60, the cathode 80 is disposed on the organic light emitting layer 72. In a region where the auxiliary electrode 60 is located, the cathode 80 is disposed on an exposed surface of the organic light emitting block 73 on the one hand, and on an exposed surface of the auxiliary electrode on the other hand, thus forming a structure wrapping the auxiliary electrode 60 and the organic light emitting block 73.

Figures 17, 18:
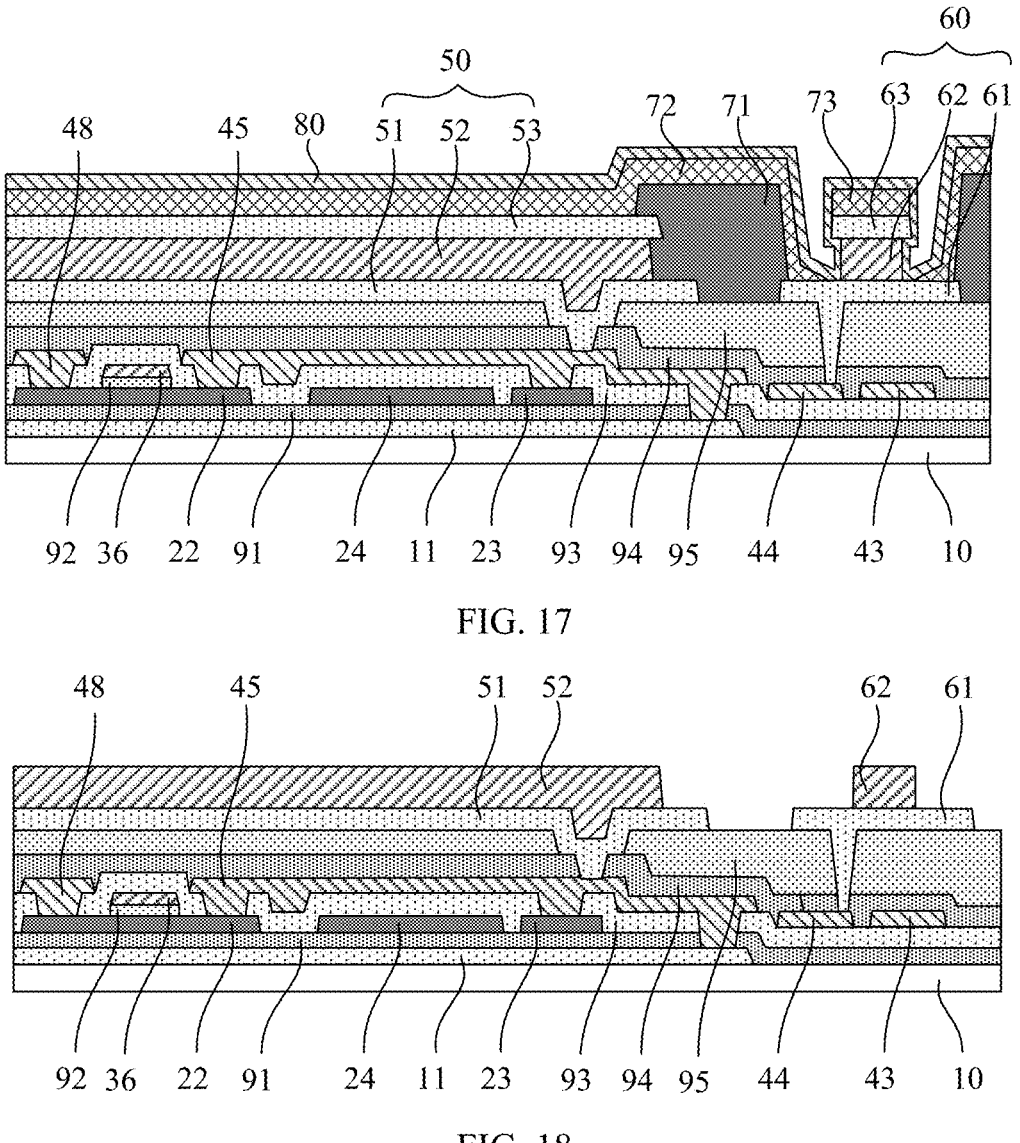
FIG. 17 is a schematic diagram obtained after a cathode pattern is formed according to an embodiment of the present disclosure.
FIG. 18 is another schematic diagram obtained after an anode and auxiliary electrode pattern is formed according to an embodiment of the present disclosure.

As shown in FIGS. 14 and 17, for the organic light emitting block 73, a part of the cathode 80 covers or partially covers the surface on a side of the organic light emitting block 73 away from the substrate, and another part of the cathode 80 covers or partially covers the side surface of the organic light emitting block 73. For the third auxiliary electrode 63, the organic light emitting block 73 covers or partially covers the surface on a side of the third auxiliary electrode 63 away from the substrate, a part of the cathode 80 covers or partially covers the second side surface 632 of the third auxiliary electrode 63, and another part of the cathode 80 covers or partially covers the second lower surface 633 of the lower side of the third auxiliary electrode 63, that is, the cathode 80 covers or partially covers the lower surface of the part of the third auxiliary electrode 63 protruding from the second auxiliary electrode 62. In this way, not only the connection between the cathode 80 and the third auxiliary electrode 63 is realized, but also the wrapping for the organic light emitting block 73 is realized. Since the cathode 80 and the third auxiliary electrode 63 are connected by the third side surface 632 and the third lower surface 633, a potential of the cathode 80 on the upper side of the organic light emitting block 73 is equal to that of the third auxiliary electrode 63 on the lower side of the organic light emitting block 73, that is, potentials of the upper and lower sides of the organic light emitting block 73 are equal, thereby ensuring that the organic light emitting block 73 does not emit light, thus avoiding the flicker phenomenon caused by light emission of the organic light emitting block 73. For the second auxiliary electrode 62, the cathode 80 covers or partially covers the second side surface 621 on the side part of the second auxiliary electrode 62. For the first auxiliary electrode 61, the cathode 80 covers or partially covers the first auxiliary electrode 61 exposed between the organic light emitting layer 72 and the second auxiliary electrode 62.

By exemplary embodiments of the present disclosure, the contact area between the cathode and the auxiliary electrode is increased effectively through the contact connection between the cathode and the side surface of the second auxiliary electrode, the resistance at the contact interface is reduced effectively, and the display effect is improved.

At this point, the light emitting structure layer pattern is prepared on the drive circuit layer. The light emitting structure layer includes an anode, an auxiliary electrode, a pixel definition layer, an organic light emitting layer and a cathode. The organic light emitting layer is respectively connected with the anode and the cathode, the cathode is connected with the auxiliary electrode, and the auxiliary electrode is connected with the second power supply line.

In an exemplary embodiment, the preparation process of the display substrate may include forming an encapsulation layer pattern, and forming the encapsulation layer pattern may include: firstly, using an open mask plate to deposit a first inorganic film by means of plasma enhanced chemical vapor deposition (PECVD) to form the first encapsulation layer. Then, ink-jet printing is performed on an organic material on the first encapsulation layer through an ink-jet printing process, and a second encapsulation layer is formed after curing. Then, a second inorganic film is deposited by using an open mask plate to form a third encapsulation layer, and the first encapsulation layer, the second encapsulation layer and the third encapsulation layer constitute an encapsulation layer. In an exemplary embodiment, the first encapsulation layer and the third encapsulation layer may be made of any one or more of silicon oxide (SiOx), silicon nitride (SiNx), and silicon nitride (SiON), and each may be in a single-layer structure, a multi-layer structure, or a composite layer structure; the second encapsulation layer may be made of a resin material, thereby forming a stacked structure of inorganic material/organic material/inorganic material, wherein the organic material layer is disposed between the two inorganic material layers, thus ensuring that the external water vapor cannot enter the light emitting structure layer.

In an exemplary embodiment, after the encapsulation layer is formed, a touch structure layer (TSP) may be formed on the encapsulation layer, and the touch structure layer may include a touch electrode layer, or include a touch electrode layer and a touch insulating layer.

In an exemplary embodiment, during the manufacturing of a flexible display substrate, the process of manufacturing the display substrate may include processes such as peeling-off of a glass carrier plate, attaching of a back film, and cutting, which is not limited in the present disclosure.

It can be seen from the structure of the display substrate and the preparation process thereof in exemplary embodiments of the present disclosure that, in a plane perpendicular to the display substrate, in an exemplary embodiment of the present disclosure, by setting the sectional shape of the auxiliary electrode into a shape like a Chinese character " 工 ", the organic light emitting layer is disconnected at the edge of the auxiliary electrode, so that the organic light emitting blocks above the auxiliary electrodes are isolated, the interference of the organic light emitting blocks with the emitted light can be avoided, the quality of the emitted light is improved, and it is beneficial to improve the display quality. In a plane perpendicular to the display substrate, according to an exemplary embodiment of the present disclosure, by setting the third auxiliary electrode in the auxiliary electrode to protrude from the second auxiliary electrode and the cathode to be connected to the third auxiliary electrode, it is realized that the two sides of the organic light emitting block have the same potential, ensuring that the organic light emitting block does not emit light and thus avoiding the flicker phenomenon caused by light emission of the organic light emitting blocks. In exemplary embodiments of the present disclosure, by setting the side contact connection between the cathode and the auxiliary electrode, the contact area between the cathode and the auxiliary electrode is increased effectively, the resistance at the contact interface is reduced effectively, and the display effect is improved. Since the method for manufacturing the display substrate according to an exemplary embodiment of the present disclosure does not adopt a laser hole forming process, not only the tact time is shortened, but also no particles are produced in the manufacturing process, thus improving the production efficiency and product yield. The preparation method for a display substrate in an exemplary embodiment of the present disclosure is high in process compatibility, production efficiency, and yield, simple in process implementation, easy to implement, and low in production cost.

In an exemplary embodiment, the display substrate may be prepared by another preparation method. Another preparation process of the display substrate may include the following operations.

(21) The process of preparing the substrate and the drive circuit layer is the same as the process of preparing the substrate and the drive circuit layer in the above embodiments, which will not be repeated here.

(22) A first transparent conductive layer and fourth metal layer pattern is formed. In an exemplary embodiment, forming a first transparent conductive layer and fourth metal layer pattern may include: sequentially depositing a first transparent conductive film and a fourth metal film on the substrate on which the above patterns are formed, and patterning the first transparent conductive film and the fourth metal film by a patterning process to form the first transparent conductive layer and fourth metal layer pattern. In an exemplary embodiment, the first conductive layer pattern includes at least a first anode 51 and a first auxiliary electrode 61. The first anode 51 is connected to a second capacitor plate 45 through an anode via, and the first auxiliary electrode 61 is connected to a second power supply line 44 through an electrode via. The fourth metal layer includes at least a second anode 52 and a second auxiliary electrode 62, the second anode 52 is arranged on the side of the first anode 51 away from the substrate and is connected to the first anode 51, and the second auxiliary electrode 62 is arranged on the side of the first auxiliary electrode 61 away from the substrate and is connected to the first auxiliary electrode 61, as shown in FIG. 18.

In an exemplary embodiment, the first transparent conductive film and the fourth metal film may be patterned by a patterning process of a halftone or gray tone mask plate. For example, patterning can include coating a layer of positive photoresist on the fourth metal film, and exposing the photoresist with a halftone or gray tone mask plate, so that the photoresist forms a fully exposed area, a partially exposed area and an unexposed area. Then, developing treatment is carried out, the photoresist in the unexposed area is retained, the photoresist has a first thickness, the photoresist of partial thickness in the partially exposed area is removed, the photoresist has a second thickness, the second thickness is less than the first thickness, and all the photoresist in the fully exposed area is removed, and the surface of the fourth metal film is exposed. Then, a first etching process is performed to etch away the first transparent conductive film and the fourth metal film in the fully exposed area to form the first anode 51 and first auxiliary electrode 61 pattern. Then, an ashing process is performed to remove the photoresist with the second thickness in the partially exposed area to expose the surface of the fourth metal film. Then, a second etching process is performed to etch away the fourth metal film in the partially exposed area to form the second anode 52 and second auxiliary electrode 62 pattern.

(23) A third anode and third auxiliary electrode pattern is formed. In an exemplary embodiment, forming the third anode and third auxiliary electrode pattern may include: depositing a second transparent conductive film on the substrate on which the above patterns are formed, and patterning the second transparent conductive film by a patterning process to form a third anode 53 and third auxiliary electrode 63 pattern, the third anode 53 is disposed on a side of the second anode 52 away from the substrate and is connected to the second anode 52, and a third auxiliary electrode 63 is disposed on a side of the second auxiliary electrode 62 away from the substrate and is connected to the second auxiliary electrode 62. The stacked first anode 51, the second anode 52 and the third anode 53 form the anode 50, and the stacked first auxiliary electrode 61, the second auxiliary electrode 62 and the third auxiliary electrode 63 form the auxiliary electrode 60, as shown in FIG. 13.

In an exemplary embodiment, in the process of patterning the second transparent conductive film, a first etchant and a second etchant may be used separately for etching, and a structure of the auxiliary electrode with a shape like a Chinese character " 工 " and a structure of the anode with a shape like a Chinese character " 工 " are formed by drilling. In an exemplary embodiment, the first etchant may be an etchant (ITO etchant) for etching a transparent conducting material, and the second etchant may be an etchant (metal etchant) for etching a metal material. In an exemplary embodiment, the etching process may include: firstly etching the second transparent conductive film with an ITO etchant to form a third anode 53 and third auxiliary electrode 63 pattern. Then, Metal etchant is used to continue etching. Since rates of etching the second anode 52 and the second auxiliary electrode 62 by the Metal etchant are greater than rates of etching the third anode 53 and the third auxiliary electrode 63, side surfaces of the second anode 52 and the second auxiliary electrode 62 are etched into pits. The first anode 51 below the second anode 52 and the third anode 53 above the second anode 52 both protrude from the second anode 52 for a certain distance to form a structure with a shape like a Chinese character " 工 ". The first auxiliary electrode 61 below the second auxiliary electrode 62 and the third auxiliary electrode 63 above the second auxiliary electrode 62 protrude from the second auxiliary electrode 62 for a certain distance to form a structure with a shape like a Chinese character " 工 ".

(24) The processes such as forming a pixel definition layer, an organic light emitting layer, and a cathode are the same as those in the above embodiments, which are not repetitively described herein.

As shown in FIGS. 5 to 18, the display substrate prepared by the aforementioned preparation process may include: a substrate 10; a first conductive layer disposed on the substrate 10, wherein the first conductive layer includes at least a shielding layer 11; a first insulating layer 91 covering the first conductive layer; a semiconductor layer disposed on the first insulating layer 91, wherein the semiconductor layer includes at least a first capacitor plate 24 and active layers of a plurality of transistors; a second insulating layer 92 disposed on the semiconductor layer; a second conductive layer disposed on the second insulating layer 92, wherein the second conductive layer includes at least a gate electrode of a plurality of transistors; a third insulating layer 93 covering the second conductive layer; a third conductive layer disposed on the third insulating layer 93, wherein the third conductive layer at least includes a second power supply line 44, a second capacitor plate 45 and first and second electrodes of a plurality of transistors, wherein the second capacitor plate 45 is connected to the shielding layer 11 through a via, the second capacitor plate 45 and the first capacitor plate 24 form a first storage capacitor, and the shielding layer 11 and the first capacitor plate 24 form a second storage capacitor; a fourth insulating layer 94 covering the third conductive layer; a flat layer 95 disposed on the fourth insulating layer 94; an anode 50 and an auxiliary electrode 60 disposed on the flat layer 95, wherein the anode 50 includes a first anode 51, a second anode 52 and a third anode 53 which are stacked and form a structure with a shape like a Chinese character " 工 ", and the auxiliary electrode 60 includes a first auxiliary electrode 61, a second auxiliary electrode 62 and a third auxiliary electrode 63 which are stacked and form a structure with a shape like a Chinese character " 工 "; a pixel definition layer 71 disposed on the flat layer 95, wherein the pixel definition layer 71 is provided with a first pixel opening and a second pixel opening, the first pixel opening exposes the third anode 53 and the second pixel opening exposes the second auxiliary electrode 62 and the third auxiliary electrode 63; an organic light emitting layer 72 disposed on the pixel definition layer 71 and an organic light emitting block 73 disposed on the third auxiliary electrode 63, wherein the organic light emitting layer 72 is connected to the third anode 53 through the first pixel opening, and the organic light emitting block 73 is disposed to be isolated from the organic light emitting layer 72; a cathode 80 disposed on the organic light emitting layer 72, wherein the cathode 80 is connected with the organic light emitting layer 72 and a large-area contact connection with the auxiliary electrode 40 is realized by wrapping the organic light emitting block 73 and the auxiliary electrode 40; an encapsulation layer disposed on the cathode 80, wherein the encapsulation layer includes a first encapsulation layer, a second encapsulation layer and a third encapsulation layer which are stacked.

The structure and its preparing process in the exemplary embodiments of the present disclosure are only exemplarily described. In an exemplary embodiment, the corresponding structure may be changed and the patterning process may be added or reduced according to the actual needs. For example, the transistor in the drive circuit layer may be a top gate structure. For another example, the drive circuit layer and the light emitting structure layer may also be provided therein with other film layer structures, electrode structures, or lead structures. For another example, the base substrate may be a glass base substrate. No specific limits are made in the present disclosure.

The present disclosure further provides a method for preparing a display substrate. In an exemplary embodiment, the method may include:

forming a drive circuit layer on a base substrate;

forming a light emitting structure layer on the drive circuit layer, wherein the light emitting structure layer includes an anode, an organic light emitting layer, an organic light emitting block, a cathode and an auxiliary electrode, the organic light emitting layer is respectively connected with the anode and the cathode, the auxiliary electrode includes a bottom surface close to the substrate, a top surface away from the substrate and a side surface arranged between the bottom surface and the top surface, the cathode is in contact with the side surface of the auxiliary electrode, the organic light emitting block is disposed on a side of the top surface of the auxiliary electrode away from the substrate, and the organic light emitting block is disposed to be isolated from the organic light emitting layer.

The present disclosure provides a method for preparing a display substrate, by setting the cross-section shape of the auxiliary electrode into a shape like a Chinese character " 工 ", the organic light emitting layer is disconnected at the edge of the auxiliary electrode and isolated from the organic light emitting block located above the auxiliary electrode, so that the interference of the organic light emitting block with the emitted light can be avoided, the quality of the emitted light is improved, and it is beneficial to improve the display quality. By setting the third auxiliary electrode in the auxiliary electrode to protrude from the second auxiliary electrode and the cathode to be connected to the third auxiliary electrode, it is realized that the two sides of the organic light emitting block have the same potential, ensuring that the organic light emitting block does not emit light and thus avoiding the flicker phenomenon caused by light emission of the organic light emitting block. By setting the side contact connection between the cathode and the auxiliary electrode, in the exemplary embodiments of the present disclosure, the contact area between the cathode and the auxiliary electrode is increased effectively, the resistance at the contact interface is reduced effectively and the display effect is improved. Since the manufacturing method in the present disclosure does not adopt a laser hole forming process, not only the tact time is shortened, but also no particles are produced in the manufacturing process, thus improving the production efficiency and product yield. The preparation method for a display substrate in the exemplary embodiments of the present disclosure is high in process compatibility, production efficiency, and yield, simple in process implementation, easy to implement, and low in production cost.

The present disclosure further provides a display device including the display substrate in the aforementioned embodiments. The display device may be any product or component with a display function, such as a mobile phone, a tablet computer, a television, a display, a laptop computer, a digital photo frame, or a navigator.

Although the implementations of the present disclosure are disclosed above, the contents are only implementations adopted to easily understand the present disclosure but not intended to limit the present disclosure. Those skilled in the art may make any modification and change to the implementation form and details without departing from the essence and scope of the present disclosure. However, the scope of patent protection of the present disclosure should still be subject to the scope defined by the appended claims.

The invention claimed is:

1. A display substrate, comprising a drive circuit layer disposed on a substrate and a light emitting structure layer disposed on a side of the drive circuit layer away from the substrate, wherein the light emitting structure layer comprises an anode, a pixel definition layer, an organic light emitting layer and a cathode disposed in sequence along a direction away from the substrate, and an auxiliary electrode and an organic light emitting block disposed in sequence along a direction away from the substrate, the pixel definition layer comprises an anode opening and an electrode opening, and the anode opening exposes the anode, the electrode opening exposes the auxiliary electrode, the organic light emitting block is separated from the organic light emitting layer, and the auxiliary electrode comprises a first auxiliary electrode, a second auxiliary electrode on a side of the first auxiliary electrode away from the substrate, and a third auxiliary electrode on a side of the second auxiliary electrode away from the substrate;

the cathode comprises a first horizontal lapping part and a second sidewall lapping part, the first horizontal lapping part laps with the first auxiliary electrode, the second sidewall lapping part laps with the second auxiliary electrode, and a thickness of the second sidewall lapping part in a direction parallel to the substrate is greater than that of the first horizontal lapping part in a direction perpendicular to the substrate, wherein the cathode further comprises a second horizontal lapping part and a third lapping part, the second horizontal lapping part laps with a surface of a part of the third auxiliary electrode protruding from the second auxiliary electrode on a side close to the substrate, the third lapping part laps with a side surface and a surface of a side of the organic light emitting block away from the substrate and a side surface of the third auxiliary electrode, and the second horizontal lapping part is connected with the third lapping part.

2. The display substrate according to claim 1, wherein the second sidewall lapping part is connected with the first auxiliary electrode, the second sidewall lapping part is in contact with a surface of the third auxiliary electrode close to the substrate, and the second sidewall lapping part is connected with the first horizontal lapping part.

3. The display substrate according to claim 1, wherein the organic light emitting layer is arranged on a side of the first auxiliary electrode away from the substrate, the organic light emitting layer is separated from the second auxiliary electrode, the cathode further comprises a first sidewall lapping part which laps with a side surface of the organic light emitting layer, and the cathode also laps with a side of the organic light emitting layer away from the substrate.

4. The display substrate according to claim 1, wherein a thickness of the third lapping part in a direction perpendicular to the substrate is greater than that of the second sidewall lapping part in a direction parallel to the substrate, and a thickness of the first sidewall lapping part in a direction parallel to the substrate is greater than that of the first horizontal lapping part in a direction perpendicular to the substrate.

5. The display substrate according to claim 2, wherein a thickness of the second sidewall lapping part in a direction parallel to the substrate is 500 angstroms to 3000 angstroms, and a thickness of the first horizontal lapping part in a direction perpendicular to the substrate is 100 angstroms to 1500 angstroms.

6. The display substrate according to claim 1, wherein the second auxiliary electrode comprises a bottom surface close to the substrate and a top surface far away from the substrate, and a side surface between the top surface and the bottom surface, and in a plane perpendicular to the substrate, an angle formed by the side surface of the second auxiliary electrode and the bottom surface of the second auxiliary electrode is less than 90°.

7. The display substrate according to claim 1, wherein the anode comprises a first anode layer, a second anode layer disposed on a side of the first anode layer away from the substrate, and a third anode layer disposed on a side of the second anode layer away from the substrate, an orthographic projection of the second anode layer on the substrate is within a range of an orthographic projection of the first anode layer on the substrate, and the orthographic projection of the second anode layer on the substrate is within a range of an orthographic projection of the third anode layer on the substrate.

8. The display substrate according to claim 7, wherein the first anode layer and the first auxiliary electrode are disposed in a same layer and made of a same material; the second anode layer and the second auxiliary electrode are disposed in a same layer and made of a same material; the third anode layer and the third auxiliary electrode are disposed in a same layer and made of a same material.

9. The display substrate according to claim 7, wherein the first anode layer has a first end and a second end in a second direction, the second anode layer has a third end and a fourth end, a size of the first end in a first direction is smaller than that of the second end in the first direction, a size of the third end in the first direction is smaller than that of the fourth end in the first direction, the auxiliary electrode is disposed between the first end and the third end, and the first direction intersects the second direction.

10. The display substrate according to claim 9, wherein the first anode layer has a portion closer to a second pixel unit than the first end in the first direction; the second anode layer has a portion closer to a first pixel unit than the third end in the first direction, and the first pixel unit is adjacent to the second pixel unit.

11. The display substrate according to claim 1, wherein the drive circuit layer comprises a transistor and a power electrode disposed on a substrate, a passivation layer disposed on a side of the transistor and the power electrode away from the substrate, and a flat layer arranged on a side of the passivation layer away from the substrate, the flat layer has an anode via and an electrode via, the power electrode and a drain electrode in the transistor are disposed in a same layer; the passivation layer is provided with a first via and a second via, the first via exposes the drain electrode of the transistor and the second via exposes the power electrode; the anode via exposes the first via, and the electrode via exposes the second via.

12. The display substrate according to claim 11, wherein the first auxiliary electrode is connected to the power electrode through the electrode via and the second via, the second auxiliary electrode is in direct contact with the first auxiliary electrode, an orthographic projection of the second auxiliary electrode on the substrate is within a range of an orthographic projection of the third auxiliary electrode on the substrate, and the orthographic projection of the second auxiliary electrode on the substrate is within a range of an orthographic projection of the first auxiliary electrode on the substrate.

13. The display substrate according to claim 11, wherein an orthographic projection of the second via on the substrate is within a range of an orthographic projection of the electrode via on the substrate, and the orthographic projection of the second via on the substrate is within a range of an orthographic projection of the third auxiliary electrode on the substrate.

14. The display substrate according to claim 1, wherein an orthographic projection of the electrode opening on the substrate is within a range of an orthographic projection of the first auxiliary electrode on the substrate.

15. The display substrate according to claim 1, wherein a plurality of the anodes are arranged in a row along a first direction, anode vias corresponding to the anodes in a same row are disposed on a same straight line extending along the first direction, and an electrode via corresponding to at least one connection electrode overlaps with an anode via in a second direction, the second direction intersects the first direction.

16. A display device, comprising the display substrate of claim 1.

17. A method for preparing a display substrate, comprising:

forming a drive circuit layer on a base substrate;

forming a light emitting structure layer on the drive circuit layer, wherein the light emitting structure layer comprises an anode, a pixel definition layer, an organic light emitting layer and a cathode which are disposed in sequence along a direction away from the substrate, and an auxiliary electrode and an organic light emitting block which are disposed in sequence along a direction away from the substrate, the pixel definition layer comprises an anode opening and an electrode opening, the anode opening exposes the anode, the electrode opening exposes the auxiliary electrode, the organic light emitting block is separated from the organic light emitting layer, the auxiliary electrode comprises a first auxiliary electrode, a second auxiliary electrode on a side of the first auxiliary electrode away from the substrate, and a third auxiliary electrode on a side of the second auxiliary electrode away from the substrate; the cathode comprises a first horizontal lapping part and a second sidewall lapping part, the first horizontal lapping part laps with the first auxiliary electrode, the second sidewall lapping part laps with the second auxiliary electrode, and a thickness of the second sidewall lapping part in a direction parallel to the substrate is greater than that of the first horizontal lapping part in a direction perpendicular to the substrate, wherein the cathode further comprises a second horizontal lapping part and a third lapping part, the second horizontal lapping part laps with a surface of a part of the third auxiliary electrode protruding from the second auxiliary electrode on a side close to the substrate, the third lapping part laps with a side surface and a surface of a side of the organic light emitting block away from the substrate and a side surface of the third auxiliary electrode, and the second horizontal lapping part is connected with the third lapping part.

18. The display substrate according to claim 2, wherein the drive circuit layer comprises a transistor and a power electrode disposed on a substrate, a passivation layer disposed on a side of the transistor and the power electrode away from the substrate, and a flat layer arranged on a side of the passivation layer away from the substrate, the flat layer has an anode via and an electrode via, the power electrode and a drain electrode in the transistor are disposed in a same layer; the passivation layer is provided with a first via and a second via, the first via exposes the drain electrode of the transistor and the second via exposes the power electrode; the anode via exposes the first via, and the electrode via exposes the second via.

19. The display substrate according to claim 3, wherein the drive circuit layer comprises a transistor and a power electrode disposed on a substrate, a passivation layer disposed on a side of the transistor and the power electrode away from the substrate, and a flat layer arranged on a side of the passivation layer away from the substrate, the flat layer has an anode via and an electrode via, the power electrode and a drain electrode in the transistor are disposed in a same layer; the passivation layer is provided with a first via and a second via, the first via exposes the drain electrode of the transistor and the second via exposes the power electrode; the anode via exposes the first via, and the electrode via exposes the second via.

* * * * *